US012388683B2

(12) United States Patent
Ishihara

(10) Patent No.: US 12,388,683 B2
(45) Date of Patent: Aug. 12, 2025

(54) ELECTRONIC CIRCUITRY AND METHOD

(71) Applicants:KABUSHIKI KAISHA TOSHIBA, Tokyo (JP); Toshiba Electronic Devices & Storage Corporation, Tokyo (JP)

(72) Inventor: Hiroaki Ishihara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 37 days.

(21) Appl. No.: 17/903,665

(22) Filed: Sep. 6, 2022

(65) Prior Publication Data

US 2023/0300007 A1 Sep. 21, 2023

(30) Foreign Application Priority Data

Mar. 16, 2022 (JP) .................................. 2022-041102

(51) Int. Cl.
*H04L 25/02* (2006.01)
*H03K 7/00* (2006.01)
*H03K 9/00* (2006.01)

(52) U.S. Cl.
CPC ........... *H04L 25/0266* (2013.01); *H03K 7/00* (2013.01); *H03K 9/00* (2013.01); *H04L 25/026* (2013.01)

(58) Field of Classification Search
CPC .............. H04L 25/026; H04L 25/0264; H04L 25/0266; H04L 25/0272; H03K 7/00; H03K 9/00

USPC ................................ 375/219, 220, 257, 258
See application file for complete search history.

(56) References Cited

U.S. PATENT DOCUMENTS

| | | | |
|---|---|---|---|
| 5,905,759 A | 5/1999 | Ishida et al. | |
| 6,389,063 B1 | 5/2002 | Kanekawa et al. | |
| 7,664,161 B2 | 2/2010 | Norimatsu et al. | |
| 7,728,680 B2 | 6/2010 | Thalheim et al. | |
| 8,704,609 B2 | 4/2014 | Kuroda | |
| 8,867,592 B2 * | 10/2014 | Shrestha | H04L 25/0268 307/104 |
| 8,873,644 B1 * | 10/2014 | Todsen | H03M 3/368 375/247 |

(Continued)

FOREIGN PATENT DOCUMENTS

| | | | |
|---|---|---|---|
| JP | H09-116575 A | 5/1997 | |
| JP | H11-196136 A | 7/1999 | |

(Continued)

OTHER PUBLICATIONS

JP Office Action issued in the Japanese Patent Application No. 2022-041102 dated Mar. 7, 2025 (11 pages).

*Primary Examiner* — Young T. Tse
(74) *Attorney, Agent, or Firm* — Foley & Lardner LLP

(57) ABSTRACT

According to one embodiment, electronic circuitry includes: transmitting circuitry to output a first waveform including N pulse waveforms (N is a natural number larger than 1) in response to an input signal; transfer circuitry to transfer the first waveform as a second waveform that includes at least N+1 pulse waveforms, via electromagnetic coupling; and receiving circuitry configured to receive the second waveform and determine the input signal based on the at least N+1 pulse waveforms.

18 Claims, 27 Drawing Sheets

(56) References Cited

U.S. PATENT DOCUMENTS

| | | | |
|---|---|---|---|
| 9,589,720 B2 | 3/2017 | Akahane | |
| 2003/0107411 A1* | 6/2003 | Martin | H04L 25/493 327/100 |
| 2012/0007438 A1* | 1/2012 | Kuroda | H04L 25/40 307/104 |
| 2012/0008344 A1 | 1/2012 | Zeng et al. | |
| 2017/0153648 A1* | 6/2017 | Sjöholm | G05D 1/0265 |
| 2018/0076715 A1* | 3/2018 | Moffat | H02M 1/08 |

FOREIGN PATENT DOCUMENTS

| | | |
|---|---|---|
| JP | 2002-171169 A | 6/2002 |
| JP | 2006-229677 A | 8/2006 |
| JP | 2007-315933 A | 12/2007 |
| JP | 2009-060272 A | 3/2009 |
| JP | 2010-103611 A | 5/2010 |
| JP | 2012-089980 A | 5/2012 |
| JP | 2013-046080 A | 3/2013 |
| JP | 2013-138389 A | 7/2013 |
| JP | 2014-078859 A | 5/2014 |
| JP | 2017-204192 A | 11/2017 |

* cited by examiner

ELECTRONIC CIRCUITRY AND METHOD

CROSS REFERENCE TO RELATED APPLICATIONS

This application is based upon and claims the benefit of priority from the prior Japanese Patent Application No. 2022-041102, filed on Mar. 16, 2022, the entire contents of which are incorporated herein by reference.

FIELD

The present embodiment relates to electronic circuitry and a method.

BACKGROUND

An input signal transmitted using insulated signal transmission is outputted as an analog waveform whose pulse edges contained in the input signal have been enhanced by band-pass filter type frequency characteristics of insulation elements.

A receiver receives as many pulses as pulses included in the analog waveform transmitted from a transmitter and thereby determines a signal. For this transmission, a method that can reduce power consumption is desired.

DETAILED DESCRIPTION

According to one embodiment, electronic circuitry includes: transmitting circuitry to output a first waveform including N pulse waveforms (N is a natural number larger than 1) in response to an input signal; transfer circuitry to transfer the first waveform as a second waveform that includes at least N+1 pulse waveforms, via electromagnetic coupling; and receiving circuitry configured to receive the second waveform and determine the input signal based on the at least N+1 pulse waveforms.

Figure 1:
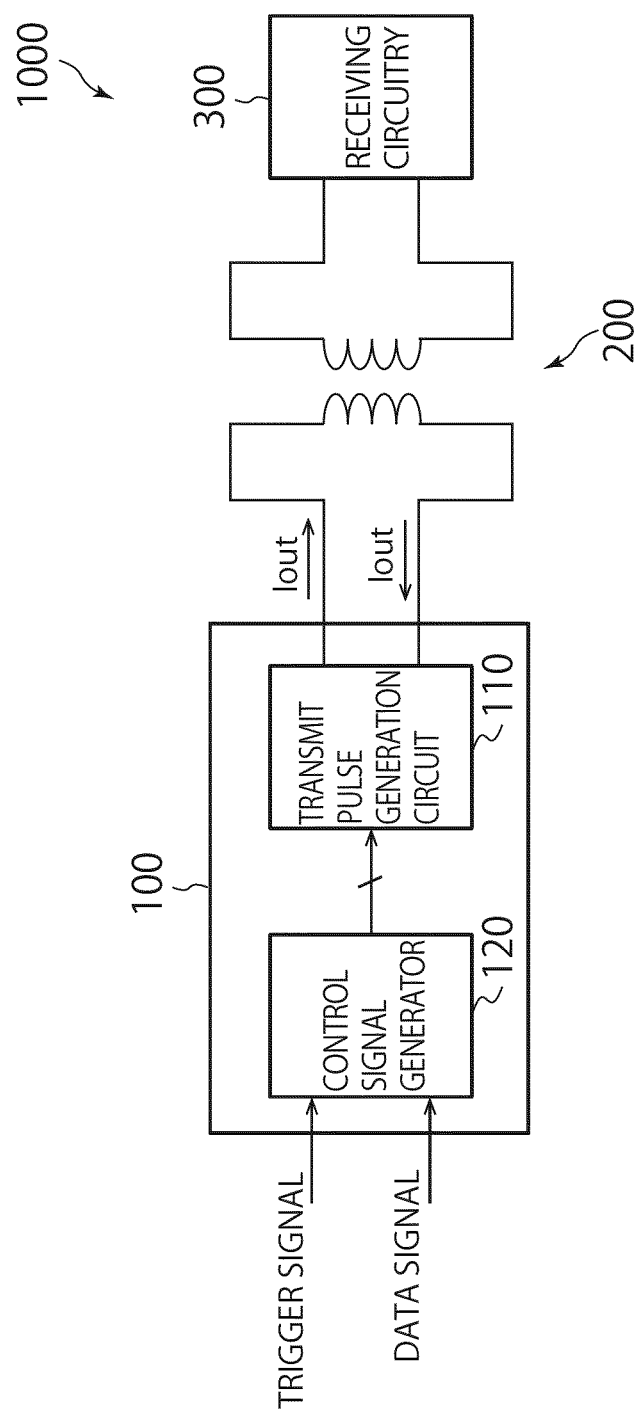
FIG. 1 is a diagram showing an overall configuration of transmitting and receiving circuitry according to the present embodiment.
Figure 2:
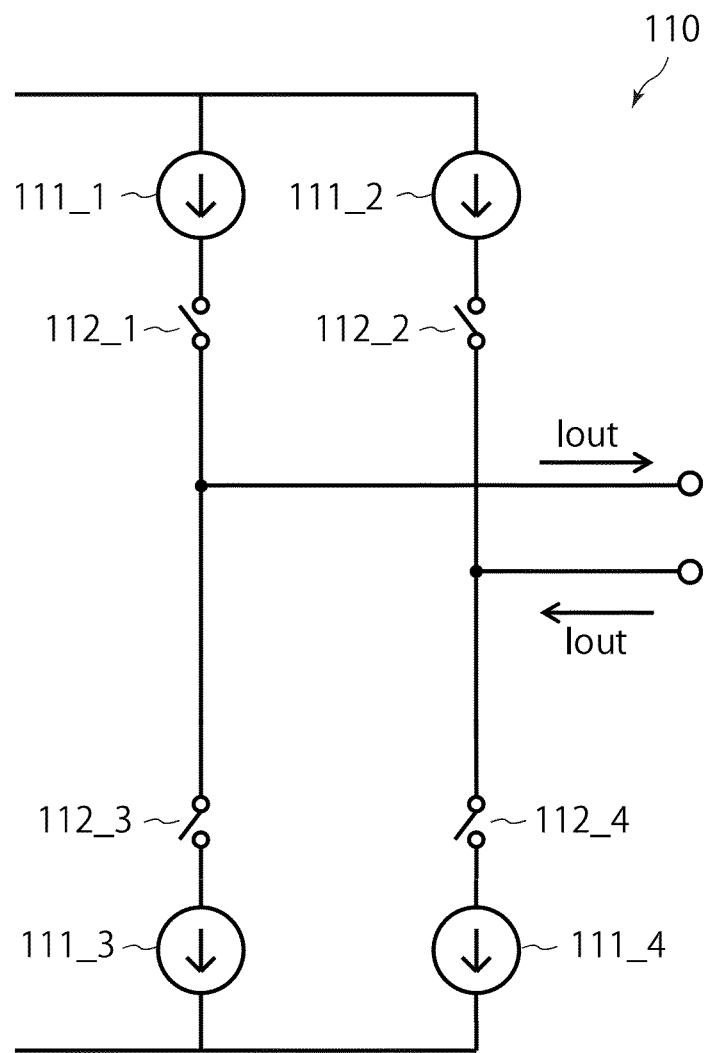
FIG. 2 is a diagram showing a circuit configuration of a transmit pulse generation circuit.
Figure 3:
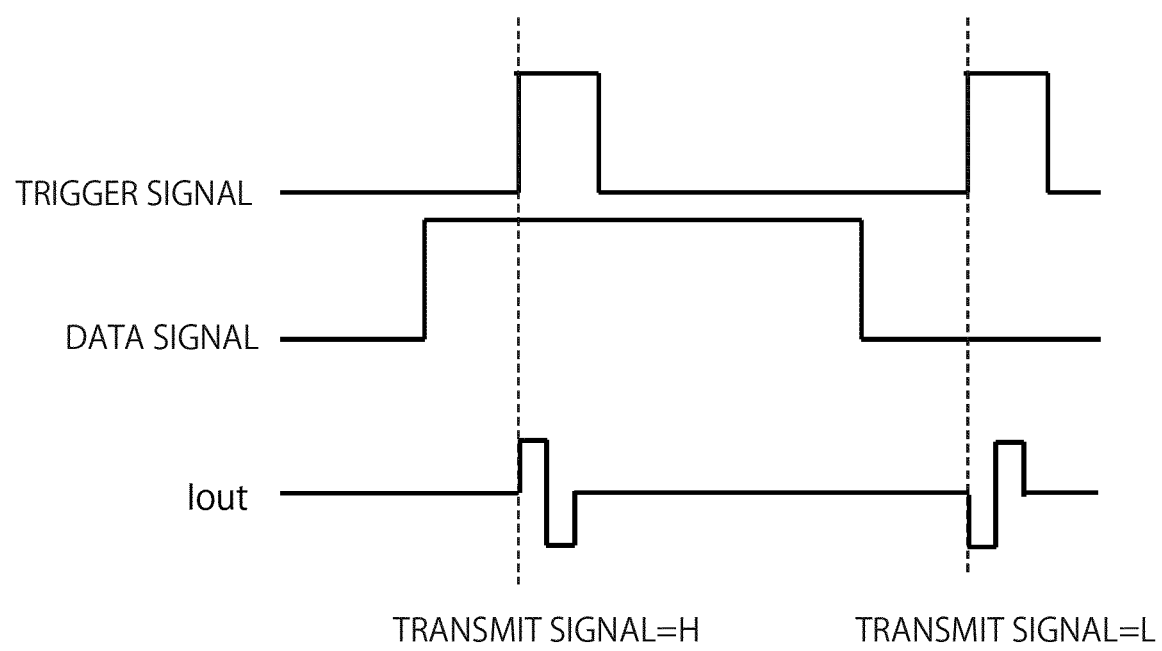
FIG. 3 is a diagram showing a transmit signal outputted in combination with a trigger signal and a data signal.
Figure 4:
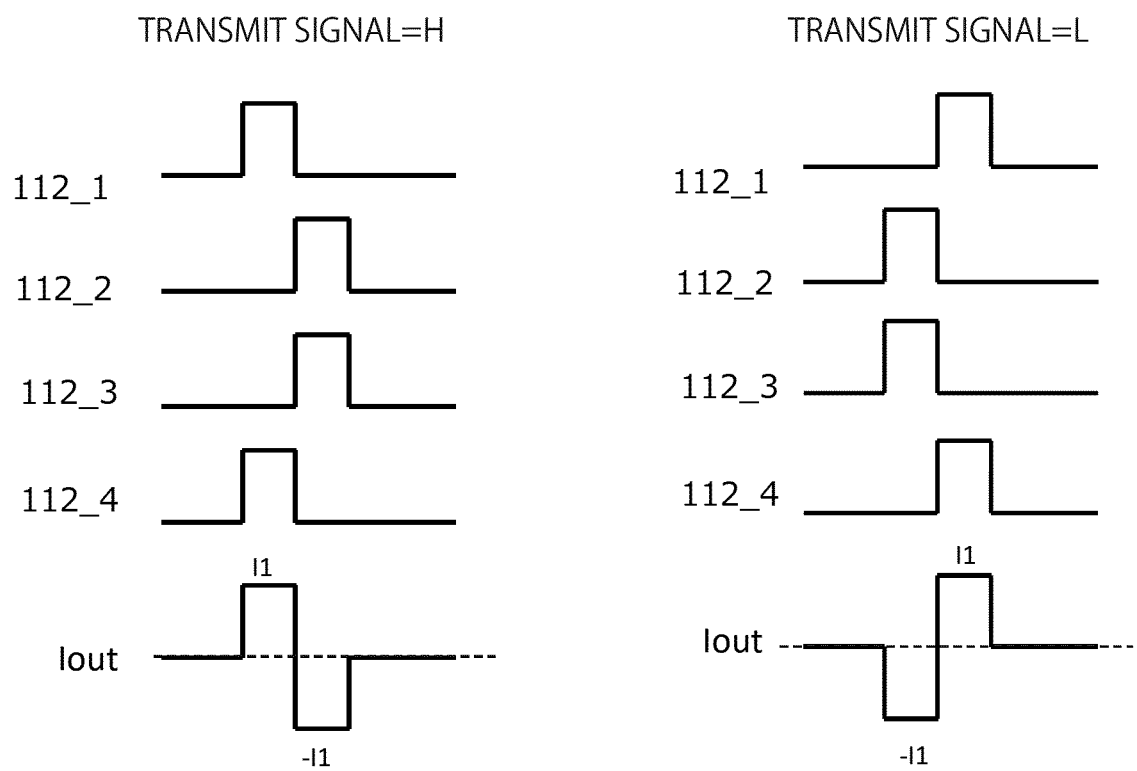
FIG. 4 is a diagram showing activation and deactivation of switches during signal transmission.

FIG. 1 shows an overall configuration of transmitting and receiving circuitry 1000 according to the present embodiment. FIG. 2 shows a circuit configuration of a transmit pulse generation circuit (transmit pulse generator) 110. FIG. 3 shows a transmit signal outputted in combination with a trigger signal and a data signal. FIG. 4 shows activation and deactivation of switches during signal transmission.

The transmitting and receiving circuitry (electronic circuitry) 1000 includes transmitting circuitry 100, an insulation element 200, and receiving circuitry 300.

The transmitting and receiving circuitry 1000 transmits signals, with the transmitting circuitry 100 on an input side and the receiving circuitry 300 on an output side being insulated by the insulation element 200, which is an electrical insulator.

The transmitting circuitry 100 outputs an analog waveform (first waveform) based on an input signal. Specifically, the transmitting circuitry 100 outputs the analog waveform (first waveform) in synchronization with transition of the input signal. The transmitting circuitry 100 may also be called a transmission device or a transmitter.

The input signal is produced, for example, by converting an analog signal outputted from a current sensor or a voltage sensor into a digital signal.

The input signal includes signals such as noise, other than an electrical signal observed by the current sensor or the voltage sensor and to be amplified.

The transition of the input signal indicates changes in the state of the input signal. The transition of the input signal includes, for example, a rising edge and falling edge of the input signal.

The transmitting circuitry 100 includes the transmit pulse generation circuit 110 and a control signal generator 120 (a control signal generation circuit).

The analog waveform outputted by the transmitting circuitry 100 is a waveform including successive pulse waveforms.

The successive pulse waveforms include not only pulse waveforms spaced without any interval, but also pulse waveforms spaced at regular intervals. The successive pulse waveforms include, for example, pulse waveforms spaced at one-second intervals.

For example, if the number of pulse waveforms is N (N is a natural number larger than 1), the transmitting circuitry 100 transmits an input signal as an analog waveform made up of N successive pulse waveforms.

The pulse waveforms can represent Boolean values if it is determined whether the pulse waveforms are High or Low based on amplitude.

For example, the analog waveform can be regarded as a digital signal represented by N bits.

In the following description, it is assumed that the number N of pulse waveforms included in the analog waveform is two, but this does not exclude cases in which the number N is other than 2.

The transmitting circuitry 100 functions as a transmitter configured to transmit an input signal by converting the input signal into an analog waveform having two pulse waveforms.

In the description given here, of the pulses outputted by the transmitting circuitry 100, the pulse outputted first is designated as a first transmit pulse (first transmit pulse waveform) and the pulse outputted next is designated as a second transmit pulse (second transmit pulse waveform).

The transmit pulse generation circuit 110 generates pulse waveforms. According to the present embodiment, the transmit pulse generation circuit 110 generates pulse waveforms using differential current pulses.

The transmit pulse generation circuit 110 includes current sources 111_1 to 111_4 and switches 112_1 to 112_4.

The current sources 111_1 to 111_4 (first current sources) pass a current of I1 and are connected to the switches 112_1 to 112_4 (first switches), respectively.

The switches 112_1 to 112_4 control outputs of the current sources by opening and closing. For example, when any of the switches turns ON, a current flows through the circuit.

In output control of the current sources, the opening and closing of the switches 112_1 to 112_4 are not limited to opening and closing of mechanical contacts.

The switches 112_1 to 112_4 may perform output control of the current sources using logic gates. For example, the switches 112_1 to 112_4 may be digital circuits such as transistors or integrated circuits (ICs).

By combining transmit pulses differing in polarity, the transmit pulse generation circuit 110 transmits two types of signals—an H signal and an L signal—as transmit signals.

The H signal, for example, indicates that a digital signal is High and the L signal, for example, indicates that a digital signal is Low.

For example, to transmit an H signal, in the first transmit pulse, the switches 112_1 and 112_4 are turned ON simultaneously, thereby outputting a current of I to Iout.

Next, in the second transmit pulse, the switches 112_2 and 112_3 are turned ON simultaneously, thereby outputting a current of −I1 to Iout.

In other words, to transmit an H signal, as shown in FIG. 4, the switch 112_1 is set to ON and OFF in order.

Similarly, the switch 112_2 is set to OFF and ON in order. The switch 112_3 is set to OFF and ON in order. The switch 112_4 is set to ON and OFF in order.

The currents flowing through Iout are outputted in the following order: I1 and −I1.

For example, to transmit an L signal, in the first transmit pulse, the switches 112_2 and 112_3 are turned ON simultaneously, thereby outputting a current of −I1 to Iout.

Next, in the second transmit pulse, the switches 112_1 and 112_4 are turned ON simultaneously, thereby outputting a current of I1 to Iout.

In other words, to transmit an L signal, as shown in FIG. 4, the switch 112_1 is set to OFF and ON in order.

Similarly, the switch 112_2 is set to ON and OFF in order. The switch 112_3 is set to ON and OFF in order. The switch 112_4 is set to OFF and ON in order.

The currents flowing through Iout are outputted in the following order: −I1 and I1.

The control signal generator 120 generates control signals for use to control operation of the switches included in the transmit pulse generation circuit 110.

The control signal generator 120 controls switch operation of the transmit pulse generation circuit 110 using two types of signals: a data signal and a trigger signal.

The trigger signal indicates timing for the transmit pulse generation circuit 110 to transmit a pulse. The trigger signal allows determination as to whether the trigger signal is High or Low.

The control signal generator 120 transmits a pulse signal on a rising edge of the trigger signal.

The data signal indicates the type of signal outputted by a transmit pulse. As with the trigger signal, the data signal allows determination as to whether the data signal is High or Low.

The control signal generator 120 controls the switches included in the transmit pulse generation circuit 110 such that transmit pulses will be outputted according to whether the data signal is High or Low.

According to the present embodiment, the control signal generator 120 transmits an H signal when the data signal is High. When the data signal is Low, the control signal generator 120 transmit an L signal.

For example, as shown in FIG. 3, at a time when a rising edge of a trigger signal is detected and the data signal is shown to be High, the transmit pulse generation circuit 110 transmits an H signal.

For example, at a time when a rising edge of a trigger signal is detected and the data signal is shown to be Low, the transmit pulse generation circuit 110 transmits an L signal.

The trigger signal and the data signal may be combined, forming an input signal that causes an analog waveform (first waveform) to be outputted.

The transmit pulse generation circuit 110 and the control signal generator 120 are integrally incorporated in the transmitting circuitry 100 according to the present embodiment, but may be provided separately.

For example, the transmitting circuitry 100 may output an analog waveform and one or both of the transmit pulse generation circuit 110 and the control signal generator 120 may be provided outside the transmitting circuitry 100.

Figure 5:
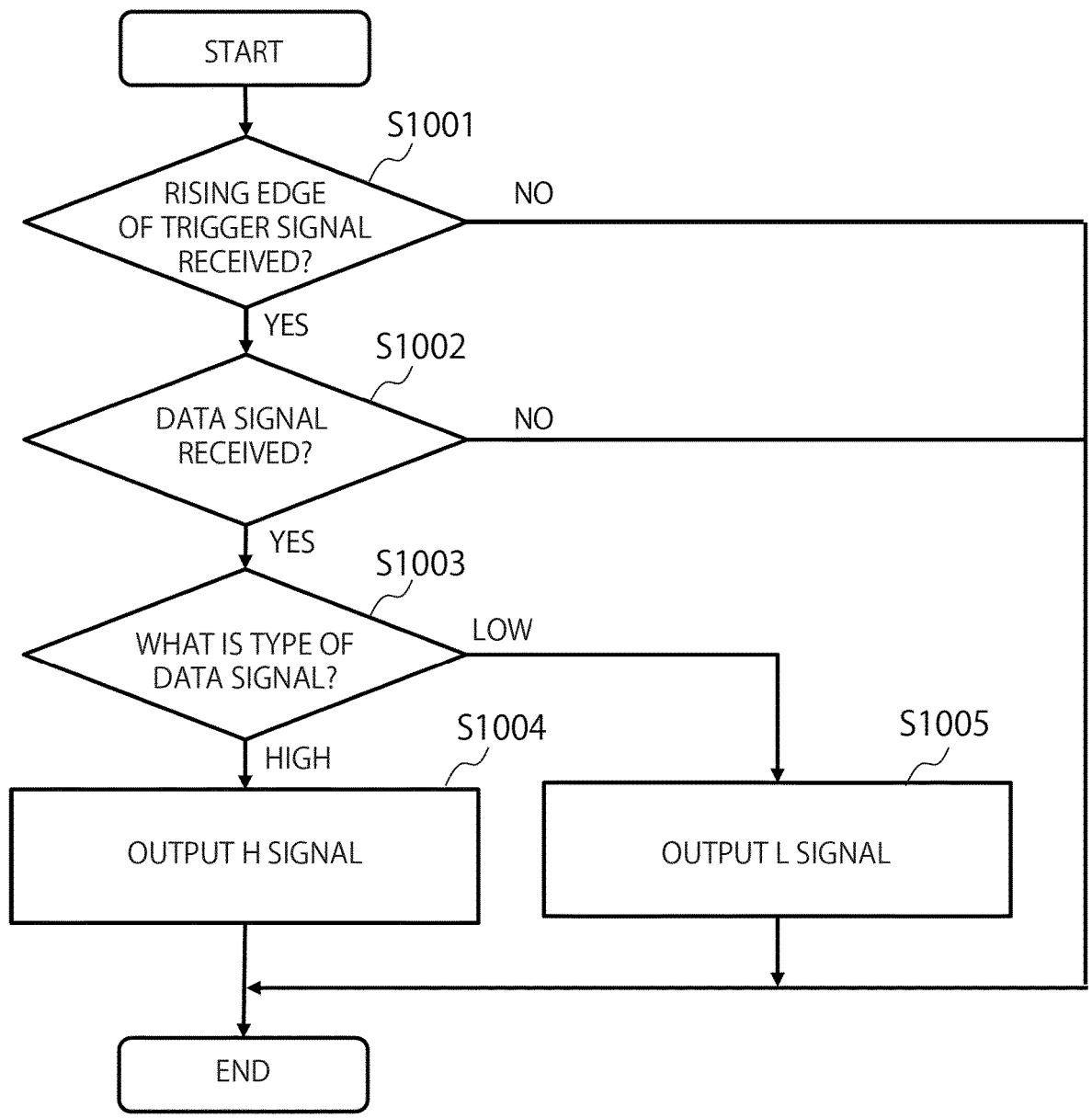
FIG. 5 is a flowchart showing an example of an operation whereby transmitting circuitry transmits an analog waveform.

FIG. 5 shows an example of an operation whereby the transmitting circuitry 100 transmits an analog waveform.

The control signal generator 120 determines whether a rising edge of a trigger signal has been received (S1001). If a rising edge of a trigger signal has been received, the control signal generator 120 goes to S1002, but otherwise finishes the process.

The control signal generator 120 determines whether a data signal has been received (S1002). If a data signal has been received, the control signal generator 120 goes to S1003, but otherwise finishes the process.

The control signal generator 120 determines the type of the received data signal (S1003). If a High data signal has been received, the control signal generator 120 goes to S1004, but if a Low data signal has been received, the control signal generator 120 goes to S1005.

If the received data signal is High, the control signal generator 120 controls the transmit pulse generation circuit 110 so as to output an H signal (S1004).

Similarly, if the received data signal is Low, the control signal generator 120 controls the transmit pulse generation circuit 110 so as to output an L signal (S1005).

Figure 6:
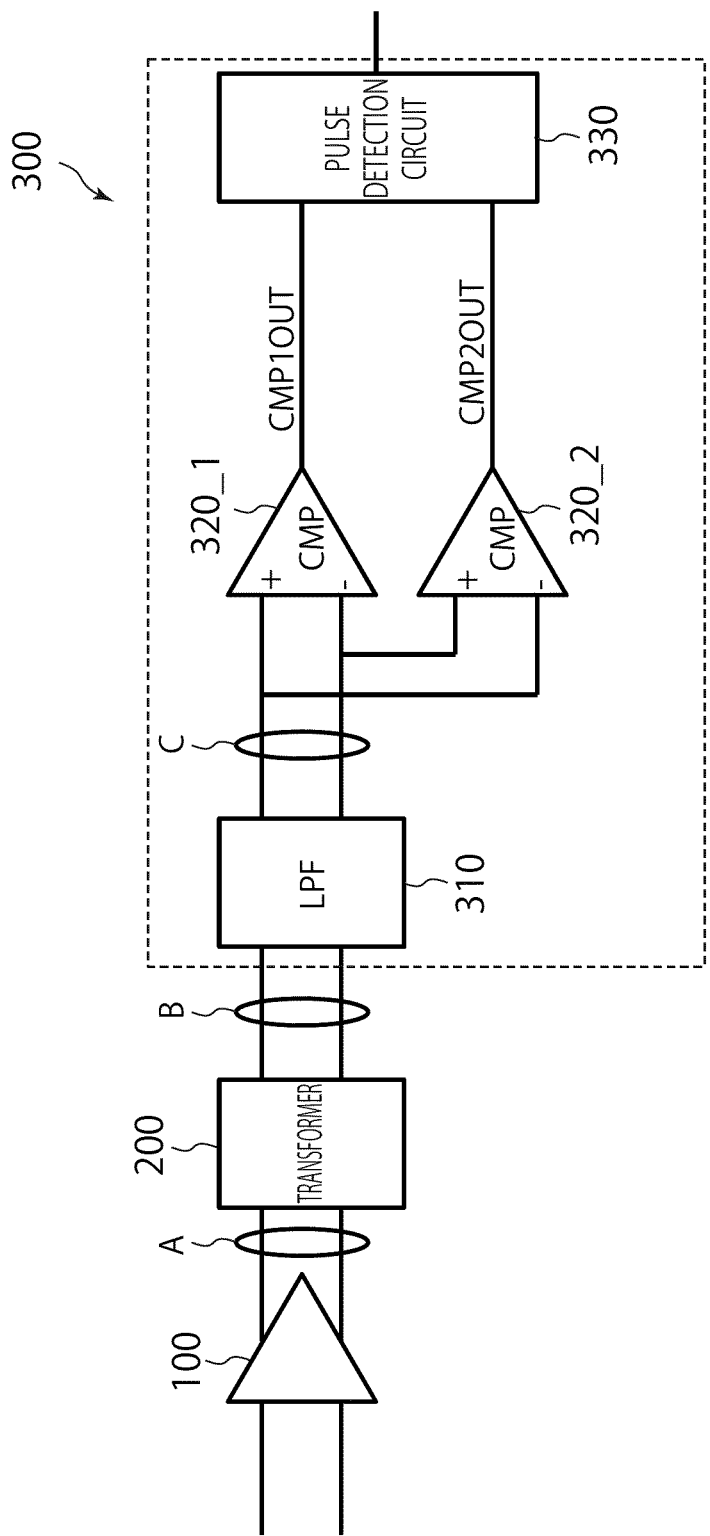
FIG. 6 is a diagram showing structures of an insulation element and receiving circuitry.
Figure 7:
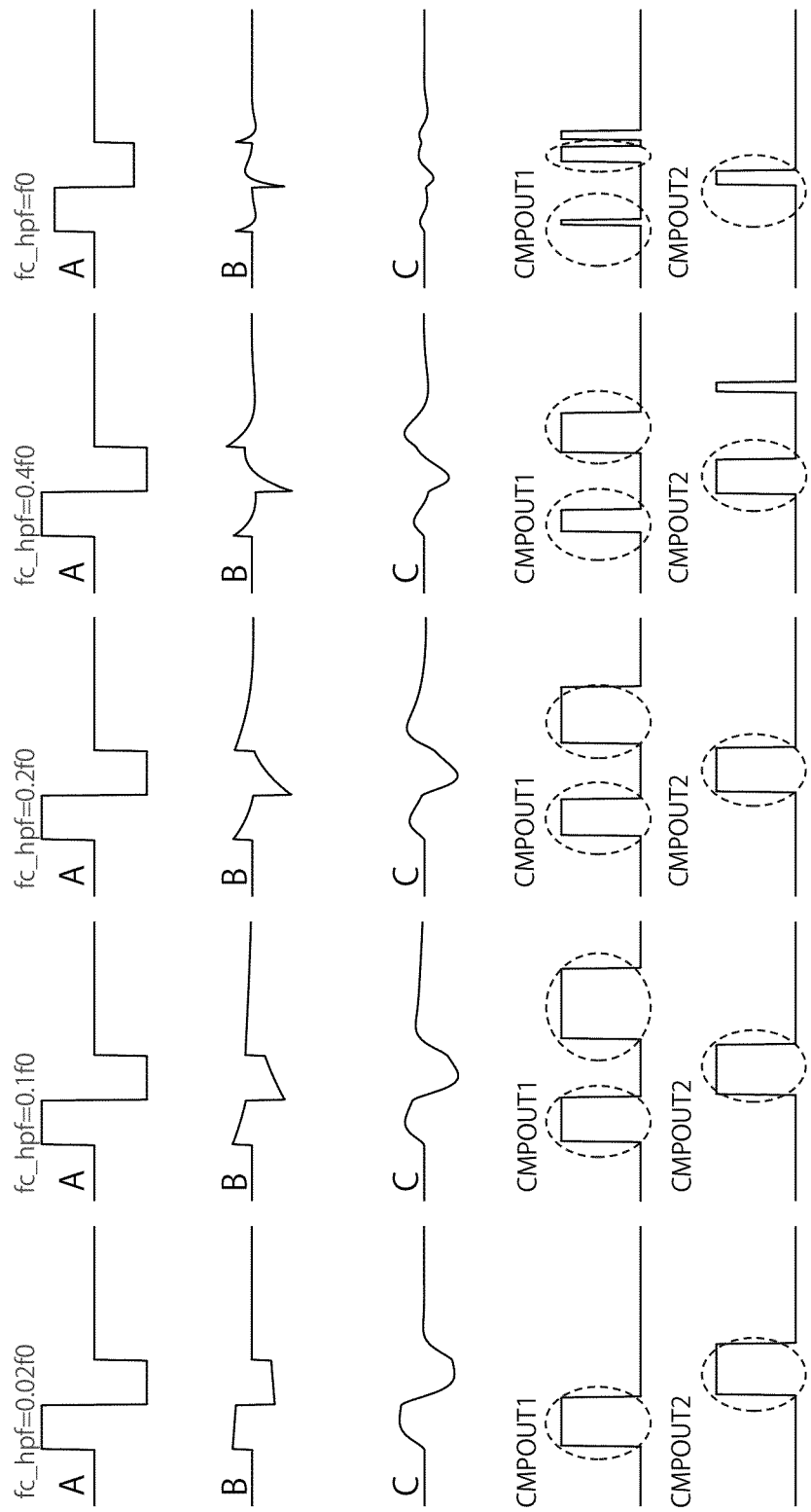
FIG. 7 is a diagram showing changes in pulses taking place on specific terminals when cut-off frequency (fc_hpf) of the insulation element is changed.

FIG. 6 is a diagram showing structures of an insulation element 200 and receiving circuitry 300. FIG. 7 shows changes in pulses taking place on specific terminals when cut-off frequency (fc_hpf) of the insulation element 200 is changed.

Using electromagnetic coupling, the insulation element 200 transmits the analog waveform transmitted from the transmitting circuitry 100. The insulation element 200 may also be called a transfer circuitry.

In so doing, the insulation element 200 functions as a filter configured to extracts specific frequency bands from a signal transmitted from the transmitting circuitry 100 (bandpass characteristics). As a result, the analog waveform transmitted from the transmitting circuitry 100 changes shape.

According to the present embodiment, the insulation element 200 is an isolation transformer made up of an insulation element to increase withstand voltage performance and provided with high-pass filter characteristics, but may be another type of element such as a condenser or a capacitor.

Using the characteristics of a high-pass filter, the insulation element 200 outputs the analog waveform (second waveform) by enhancing a frequency component corresponding to the pulse width. The analog waveform whose frequency component is enhanced by the insulation element 200 includes a signal such as noise other than the electrical signal to be amplified.

An analog waveform outputted by the insulation element 200 includes a first receive pulse based on a first transmit pulse and a second receive pulse based on a second transmit pulse. Besides, the analog waveform outputted by the insulation element 200 includes a third receive pulse, which is an enhanced pulse waveform produced when the first transmit pulse and the second transmit pulse have their frequency components enhanced by the insulation element 200.

The insulation element 200 outputs an analog waveform including three pulse waveforms to the receiving circuitry 300. In other words, the insulation element 200 outputs pulse waveforms larger in number than the two pulse waveforms included in the analog waveform outputted by the transmitting circuitry 100.

For example, if the number of pulse waveforms included in the analog waveform is N, the receiving circuitry 300 determines the signal based on at least N+1 pulse waveforms.

On the transmitting and receiving circuitry 1000, an analog waveform transmitted by the transmitting circuitry 100 is passed through the insulation element 200 and then through a low-pass filter 310 described later, and subsequently received by a pulse detection circuit 330 and the like.

If tpulse designates pulse width and a fundamental frequency is given as f0=1/tpulse, when the cut-off frequency (fc_hpf) of the high-pass filter 210 is changed in a range of 0.02f0 to f0 on terminals A, B, and C in FIG. 6, resulting waveforms are shown as in FIG. 7.

If the receiving circuitry 300 receives a larger number of pulse waveforms than the number N of pulse waveforms included in the analog waveform transmitted by the transmitting circuitry 100, it is necessary to set the cut-off frequency of the insulation element 200 appropriately.

For example, in the present embodiment, when the cut-off frequency of the insulation element 200 is changed on terminals A, B, and C shown in FIG. 6, results are shown as in FIG. 7.

The waveform measured on terminal A in FIG. 6 is an analog waveform immediately after transmission from the transmitting circuitry 100, i.e., a waveform resulting from measurement of the transmit pulse. The waveform measured on terminal B in FIG. 6 is an analog waveform immediately after passage through the insulation element 200. The waveform measured on terminal C in FIG. 6 is an analog waveform immediately after passage through the low-pass filter 310, i.e., a waveform resulting from measurement of the receive pulse.

When fc_hpf is 0.02fc, two receive pulses corresponding to two transmit pulses transmitted are observed on terminal C.

In so doing, on the receiving circuitry 300, pulses based on the two receive pulses are reproduced and reception based on three receive pulses is disabled.

When fc_hpf is 0.1fc to 0.4fc, three receive pulses corresponding to two transmit pulse waveforms transmitted are observed on terminal C.

In other words, if appropriate cut-off frequencies are selected on the insulation element 200, an outline of the receive pulses measured on terminal C is reproduced.

The receiving circuitry 300 receives an analog waveform. The receiving circuitry 300 may also be called a receiver. The analog waveform received by the receiving circuitry 300 is a transmit signal from which noise and the like have been removed by the insulation element 200.

From the receive pulses included in the received analog waveform, the receiving circuitry 300 determines whether digital signals are High or Low, and thereby reproduces the input signal.

The receiving circuitry 300 includes a low-pass filter 310, a comparator 320, and a pulse detection circuit 330.

The low-pass filter 310 gradually reduces frequency components higher than a cut-off frequency without attenuating frequency components lower than the cut-off frequency.

Due to the characteristics of the insulation element 200 as a high-pass filter, a signal outputted from the insulation element 200 mainly includes frequency components higher than the cut-off frequency (by attenuating the frequency components lower than the cut-off frequency).

The low-pass filter 310 gradually reduces the frequency components higher than the cut-off frequency from the signal to extract a signal having appropriate frequency components.

When there is no need to extract frequency components from a signal outputted from the insulation element 200, e.g., when the transmitting circuitry 100 is mainly made up of specific low frequency components, the low-pass filter 310 may be bypassed.

In any case, the receive pulses received by the receiving circuitry 300 are pulses resulting from extraction of specific frequency components as with a signal passed through a band-pass filter.

The comparator 320 detects a pulse signal.

The comparator 320 outputs a signal according to polarity of the detected pulse signal.

According to the present embodiment, the comparator 320 shapes the signal extracted by the low-pass filter 310 into a rectangular wave. Specifically, if the pulse signal is High, the comparator 320 outputs a High rectangular wave. If the pulse signal is Low, the comparator 320 does not produce any output.

The comparator 320 transmits the rectangular wave to the pulse detection circuit 330.

According to the present embodiment, the comparator 320 includes two comparators 320_1 and 320_2.

The comparator 320_1 (first comparator) and the 320_2 (second comparator) are opposite to each other in terms of inverting input connection and non-inverting input connection.

For example, a circuit connected to the non-inverting input of the comparator 320_1 is connected to the inverting input of the comparator 320_2. Similarly, a circuit connected to the inverting input of the comparator 320_1 is connected to the non-inverting input of the comparator 320_2.

The comparators 320_1 and 320_2 output CMPOUT1 and CMPOUT2, respectively, to the pulse detection circuit 330.

Figure 8:
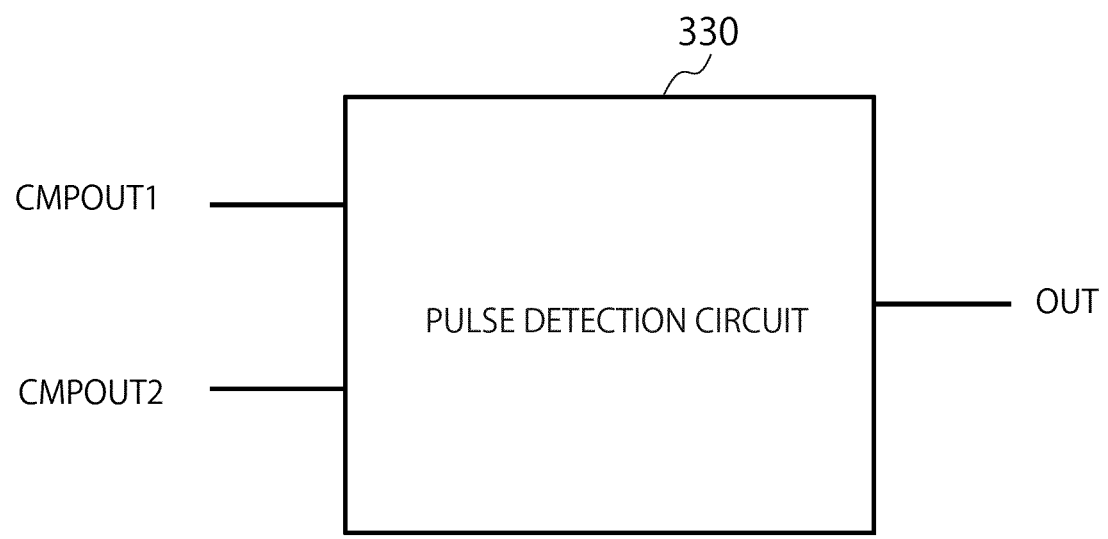
FIG. 8 is a conceptual diagram showing a structure of a pulse detection circuit.
Figure 9:
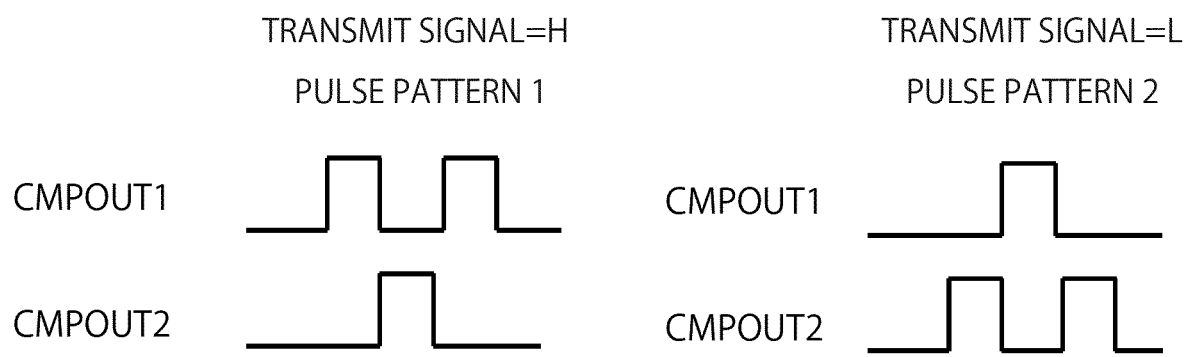
FIG. 9 is a diagram showing a relationship between transmit signals and pulse patterns.

FIG. 8 is a conceptual diagram showing a structure of the pulse detection circuit 330. FIG. 9 shows a relationship between transmit signals and pulse patterns.

Figure 10:
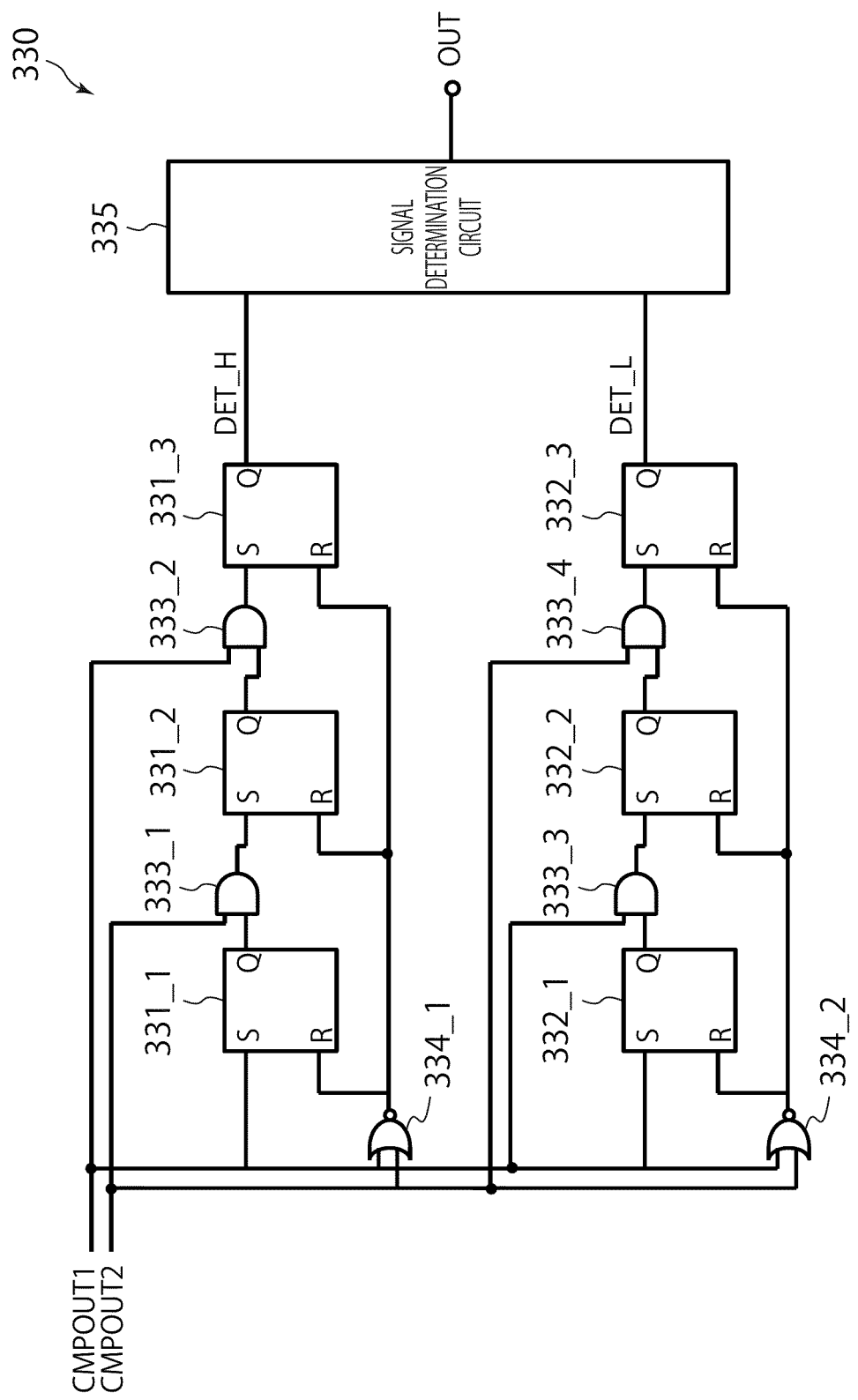
FIG. 10 is a diagram showing a configuration of a pulse detection circuit.
Figure 11:
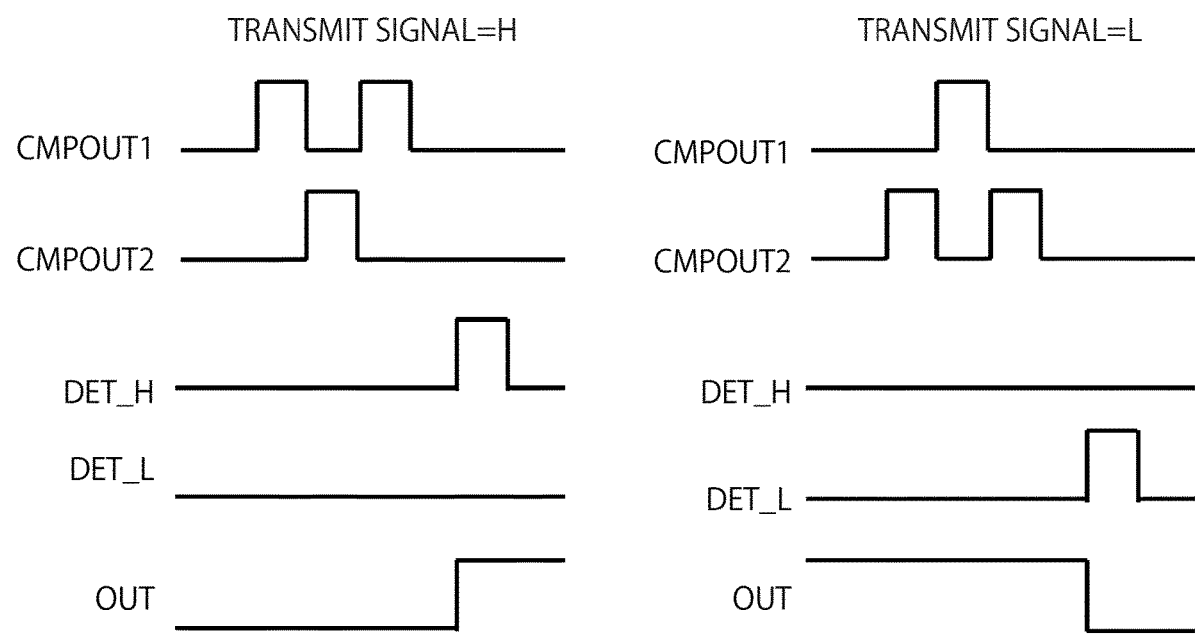
FIG. 11 is a diagram showing an operation concept of the pulse detection circuit.

FIG. 10 shows a circuit structure of the pulse detection circuit 330. FIG. 11 shows an operation concept of the pulse detection circuit 330.

The pulse detection circuit 330 detects pulse waveforms outputted by the comparator 320. Specifically, the pulse detection circuit 330 outputs a signal by comparing the detected pulse waveforms with specific pulse patterns. The pulse detection circuit 330 may also be called a pulse detector.

The pulse detection circuit 330 determines whether waveforms of CMPOUT1 and CMPOUT2 accepted as input match any of predetermined pulse patterns 1 and 2.

For example, if the pulse detection circuit 330 is configured to output High when pulse pattern 1 is matched and output Low when pulse pattern 2 is matched, an output signal can be determined based on a transmitted pulse pattern.

The pulse detection circuit 330 makes the determination by detecting the rising edge of the output from the comparator 320.

For example, in detecting pulse pattern 1, as shown in FIG. 9, a waveform made up of Input, No Input, and Input is received as CMPOUT1.

The pulse detection circuit 330 recognizes the waveform by detecting a rising edge of CMPOUT1.

Similarly, a waveform made up of No Input, Input, and No Input is received as CMPOUT1.

The pulse detection circuit 330 recognizes the waveform by detecting a rising edge of CMPOUT2.

The pulse detection circuit 330 recognizes the waveforms in the following order: a rising edge of the input from CMPOUT1, a rising edge of the input from CMPOUT2, and a rising edge of the input from CMPOUT1.

The pulse detection circuit 330 compares the recognized waveforms with pulse pattern 1 and thereby checks for a match. The pulse detection circuit 330 outputs a High signal corresponding to pulse pattern 1.

For example, in detecting pulse pattern 2, as shown in FIG. 9, a waveform made up of No Input, Input, and No Input is received as CMPOUT1.

Similarly, a waveform made up of Input, No Input, and Input is received as CMPOUT2.

The pulse detection circuit 330 recognizes the waveforms in the following order: a rising edge of the input from CMPOUT2, a rising edge of the input from CMPOUT1, and a rising edge of the input from CMPOUT2.

The pulse detection circuit 330 compares the recognized waveforms with pulse pattern 2 and thereby checks for a match. The pulse detection circuit 330 outputs a Low signal corresponding to pulse pattern 2.

Specifically, the pulse detection circuit 330 includes sets of series-connected three flip-flops 331 and 332, AND gates 333, NOR gates 334, and a signal determination circuit 335.

The three flip-flops 331 are connected in series.

The flip-flops 331 are made up of flip-flops 331_1 to 331_3. The flip-flops 331 make up a circuit in which as many flip-flops as the number of pulse waveforms received by the receiving circuitry 300 are connected in series.

According to the present embodiment, in the receiving circuitry 300, since three pulse waveforms are received, three flip-flops are connected in series via the AND gates between the flip-flops.

For example, if the receiving circuitry 300 receives N+1 pulse waveforms, N+1 flip-flops are connected in series via the AND gates between the flip-flops.

Of the flip-flop 331_1, a set terminal S is connected with CMPOUT1 and a reset terminal R is connected with a NOR gate 334_1. The flip-flop 331_1 outputs an output result (first output signal) from an output terminal Q and transmits the output result to an AND gate 333_1.

Of a flip-flop 331_2, a set terminal S is connected with an output result of the AND gate 333_1 and a reset terminal R is connected with the NOR gate 334_1. The flip-flop 331_2 outputs an output result (first output signal) from an output terminal Q and transmits the output result to an AND gate 333_2.

Of a flip-flop 331_3, a set terminal S is connected with an output result of the AND gate 333_2 and a reset terminal R is connected with the NOR gate 334_1. The flip-flop 331_3 outputs an output result as DET_H (second output signal) from an output terminal Q and transmits the output result to the signal determination circuit 335.

For example, when CMPOUT1 and CMPOUT2 become High in the order—CMPOUT1, CMPOUT2, and CMPOUT1, the flip-flop 331 outputs DET_H indicating a High state.

Three flip-flops 332 are connected in series.

The flip-flops 332 are made up of flip-flops 332_1 to 332_3. The flip-flops 332 make up a circuit in which as many flip-flops as the number of pulse waveforms received by the receiving circuitry 300 are connected in series.

According to the present embodiment, in the receiving circuitry 300, which receives three pulse waveforms, three flip-flops are connected in series via AND gates between the flip-flops.

Of the flip-flop 332_1, a set terminal S is connected with CMPOUT1 and a reset terminal R is connected with a NOR gate 334_2. The flip-flop 332_1 outputs an output result from an output terminal Q and transmits the output result to an AND gate 333_3.

Of a flip-flop 332_2, a set terminal S is connected with an output result of the AND gate 333_3 and a reset terminal R is connected with the NOR gate 334_2. The flip-flop 332_2 outputs an output result from an output terminal Q and transmits the output result to an AND gate 333_4.

Of a flip-flop 332_3, a set terminal S is connected with an output result of the AND gate 333_4 and a reset terminal R is connected with the NOR gate 334_2. The flip-flop 332_3 outputs an output result as DET_L (second output signal) from an output terminal Q and transmits the output result to the signal determination circuit 335.

For example, when CMPOUT1 and CMPOUT2 become High in the order—CMPOUT2, CMPOUT1, and CMPOUT2, the flip-flop 332 outputs DET_L indicating a Low state.

In other words, if the Mth pulse waveform (M is a natural number between 1 and N, both inclusive) of a receive pulse included in an analog waveform matches a corresponding pulse waveform of pulse pattern 1 or pulse pattern 2, the Mth flip-flop connected in series outputs the Mth pulse waveform to the (M+1)th flip-flop connected next.

Similarly, the flip-flops 331 and 332 repeats a similar process for the first to (N+1)th flip-flops and outputs DET_H or DET_L.

To prevent erroneous determination due to noise components and the like other than the received pulse signal, the flip-flops 331 and 332 may be configured not to respond to pulses longer or shorter by a predetermined amount than a pulse signal to be transmitted.

For example, by setting a response time of the flip-flops 331 and 332 appropriately, short pulses can be removed.

For example, by adding a timeout-based reset mechanism to the flip-flops 331 and 332 themselves, long pulses may be removed.

The NOR gates 334 are intended to reset the flip-flops 331 and 332, respectively.

When the signal received by the receiving circuitry 300 comes to an end, i.e., when both CMPOUT1 and CMPOUT2 become Low, the NOR gates 334 reset the respective flip-flops 331 and 332 such that determination of the signal to be received next will not be affected.

Based on DET_H and DET_L, the signal determination circuit 335 determines whether the transmitted signal is High or Low. The signal determination circuit 335 may also be called a signal determinator.

As shown in FIG. 11, the output is determined based on DET_H and DET_L, which in turn are based on the outputs of CMPOUT1 and CMPOUT2.

FIGS. 12A to 12F compare a case in which the number N of pulse waveforms is three with a case in which the number N is two.

Figure 13:
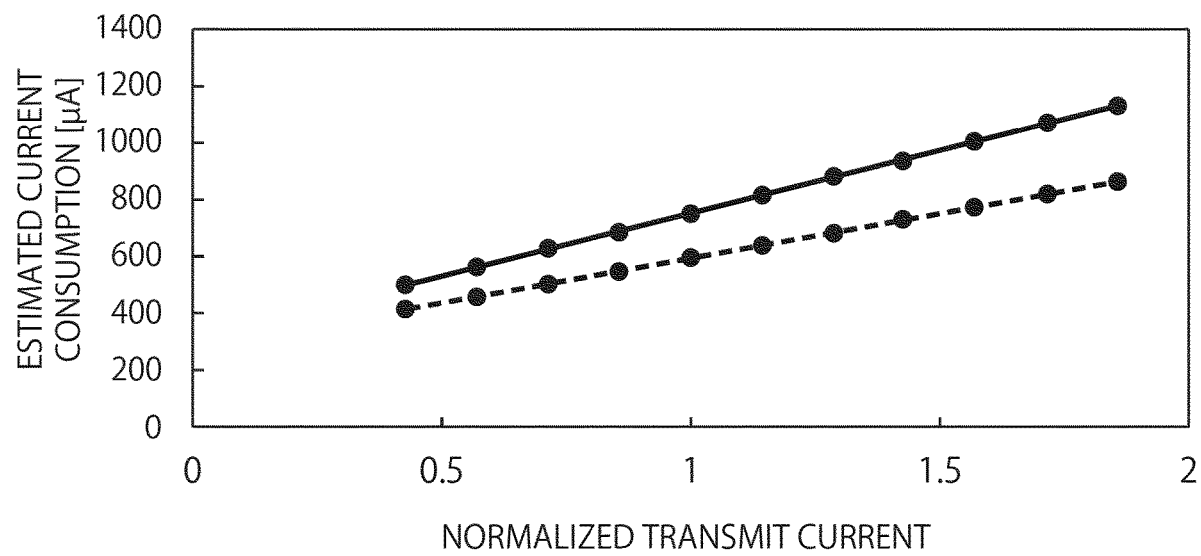
FIG. 13 is a diagram showing a relationship between the number of pulses included in an analog waveform and power consumption.

FIG. 13 shows a relationship between the number of pulses included in an analog waveform and power consumption.

The pulses included in the analog waveform allows determination as to whether the pulses are High or Low, based on amplitude.

In so doing, the High state may mean High in a positive output direction or High in a negative output direction.

The pulses included in the analog waveform repeats a positive output (P) and a negative output (N). For example, when a first transmit pulse is High, the analog waveform produces a positive High output.

When a second transmit pulse is High, a negative High output is produced. Similarly, a positive output and a negative output are repeated.

Figure 12A:
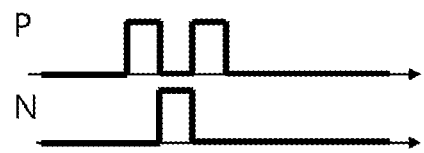
FIGS. 12A to 12F are diagrams comparing a case in which the number N of pulse waveforms is three with a case in which the number N is two.

For example, as shown in FIG. 12A, when the number N of pulses included in an analog waveform is three, the first transmit pulse and the third transmit pulse are outputted in a positive High state and the second transmit pulse is outputted in a negative High state.

Figure 12D:
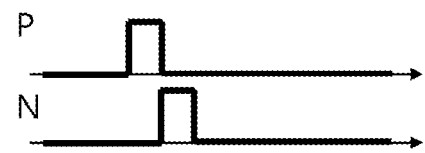
Figure 12B:
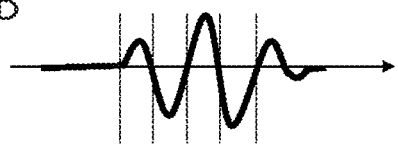

In this case, the output pulses are outputted through the insulation element 200 as an analog waveform such as shown in FIG. 12B.

Figure 12E:
Figure 12C:
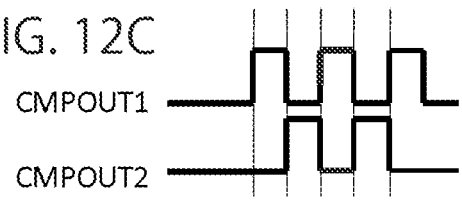

Next, the waveform is outputted from the comparator 320 in the form shown in FIG. 12C. The pulse detection circuit 330 detects the pulse by detecting a rising edge of the output.

For example, as shown in FIG. 12D, when the number N of pulses included in an analog waveform is two, the first transmit pulse is outputted in a positive High state and the second transmit pulse is outputted in a negative High state.

In this case, the pulses are outputted through the insulation element 200 as an analog waveform such as shown in FIG. 12E.

Figure 12F:
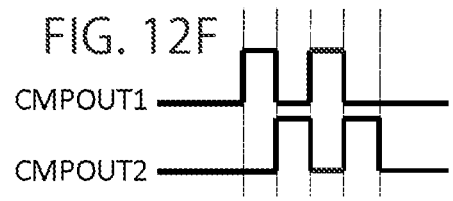

Next, the waveform is outputted from the comparator 320 in the form shown in FIG. 12F. The pulse detection circuit 330 detects the pulse by detecting a rising edge of the output.

Regardless of whether the number N of pulses is two or three, the pulse detection circuit 330 can detect three rising edges. In other words, even if the number of pulse waveforms included in the analog waveform outputted by the transmitting circuitry 100 is small, rising edges of output with the same number of pulse waveforms can be detected.

Consumed power increases with increases in the number of pulse waveforms included in the analog waveform outputted by the transmitting circuitry 100. In other words, power consumption of the transmitting and receiving circuitry 1000 is proportional to the number of pulse waveforms included in the analog waveform.

For example, in FIG. 13, the abscissa represents transmit current and the ordinate represents estimated current consumption of the transmitting and receiving circuitry 1000. In FIG. 13, the solid line represents a case in which the number of pulse waveforms included in the analog waveform outputted by the transmitting circuitry 100 is three and the broken line represents a case in which the number of pulse waveforms included in the analog waveform outputted by the transmitting circuitry 100 is two.

The current consumption of the transmitting and receiving circuitry 1000 can be reduced when the number of pulse waveforms included in the analog waveform outputted by the transmitting circuitry 100 is two compared to when the number is three.

Figure 14B:
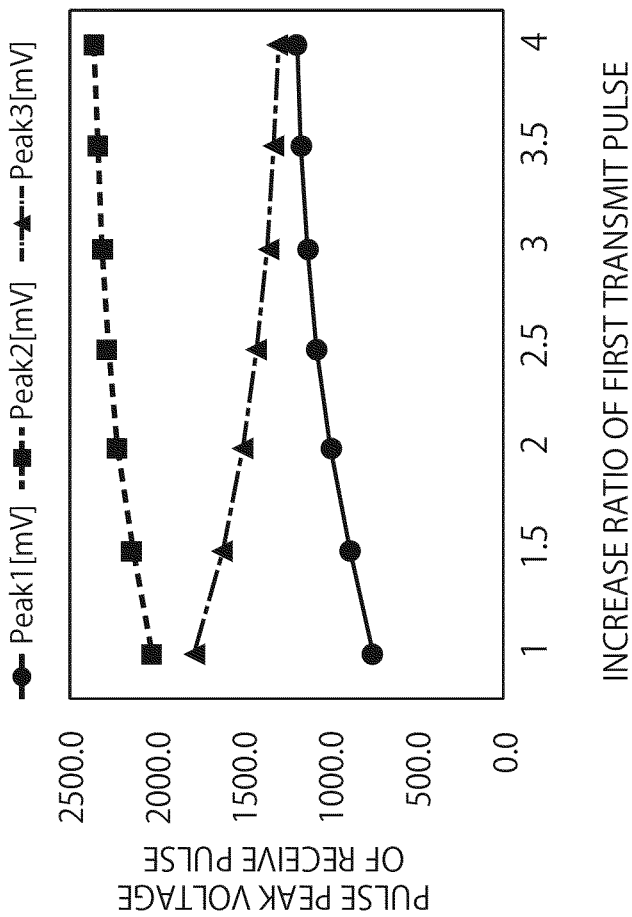
FIGS. 14A and 14B are diagrams showing signal amplitude and power consumption when a first transmit pulse is increased.
Figure 14A:
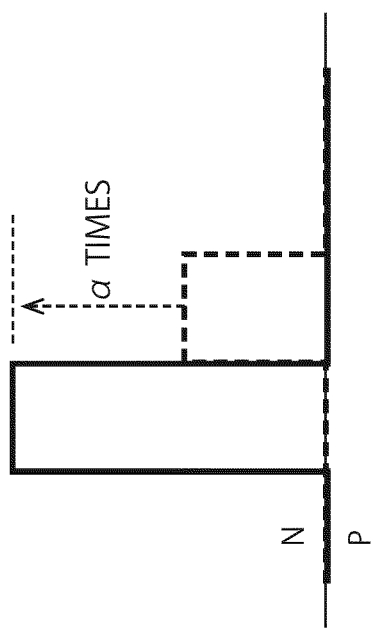

FIGS. 14A and 14B show signal amplitude and power consumption when a first transmit pulse is increased.

According to the present embodiment, all the pulse waveforms included in the analog waveform outputted by the transmitting circuitry 100 are equal in height, but may be different in height.

For example, the first transmit pulse may be higher in power, i.e., higher in signal amplitude, than the other transmit pulses.

When the first transmit pulse and the other transmit pulses are equal in power, as a result of transmission through the insulation element 200, the first receive pulse becomes the lowest in signal amplitude.

As shown in FIG. 14A, the signal amplitude of the first transmit pulse with positive High output is a times the signal amplitude of the second transmit pulse with negative High output, increasing the signal amplitude of the first receive pulse and thereby allowing the receiving circuitry 300 to receive the signal.

In FIG. 14B, the abscissa represents the increase ratio of the first transmit pulse and the ordinate represents the pulse peak voltage of the receive pulse. In FIG. 14B, the solid line represents the first receive pulse, the chain line represents the second receive pulse, and the dashed line represents the third receive pulse.

For example, as shown in FIG. 14B, when the first transmit pulse is one time or more, the other receive pulses become higher than the first receive pulse whose pulse peak voltage is the lowest. In other words, the other receive pulses have higher signal amplitudes than the first receive pulse.

In any case, since the first transmit pulse is a times the second transmit pulse, the analog waveform including N transmitted pulses does not preclude output of an analog waveform including N+1 pulses, and both the analog waveforms can be outputted simultaneously.

Thus, according to the present embodiment, from the analog waveform including two pulses and transmitted by the transmitting circuitry 100, the transmitting and receiving circuitry 1000 can receive three pulses using the analog waveform received by the receiving circuitry 300.

This allows the receiving circuitry 300 to determine the signal based on a larger number of pulse waveforms than the pulse waveforms included in the analog waveform outputted by the transmitting circuitry 100. In other words, the transmitting and receiving circuitry 1000 can transmit signals at reduced power consumption. Besides, the transmitting and receiving circuitry can transmit signals resistant to noise and disturbances.

(Variation 1)

Figure 15:
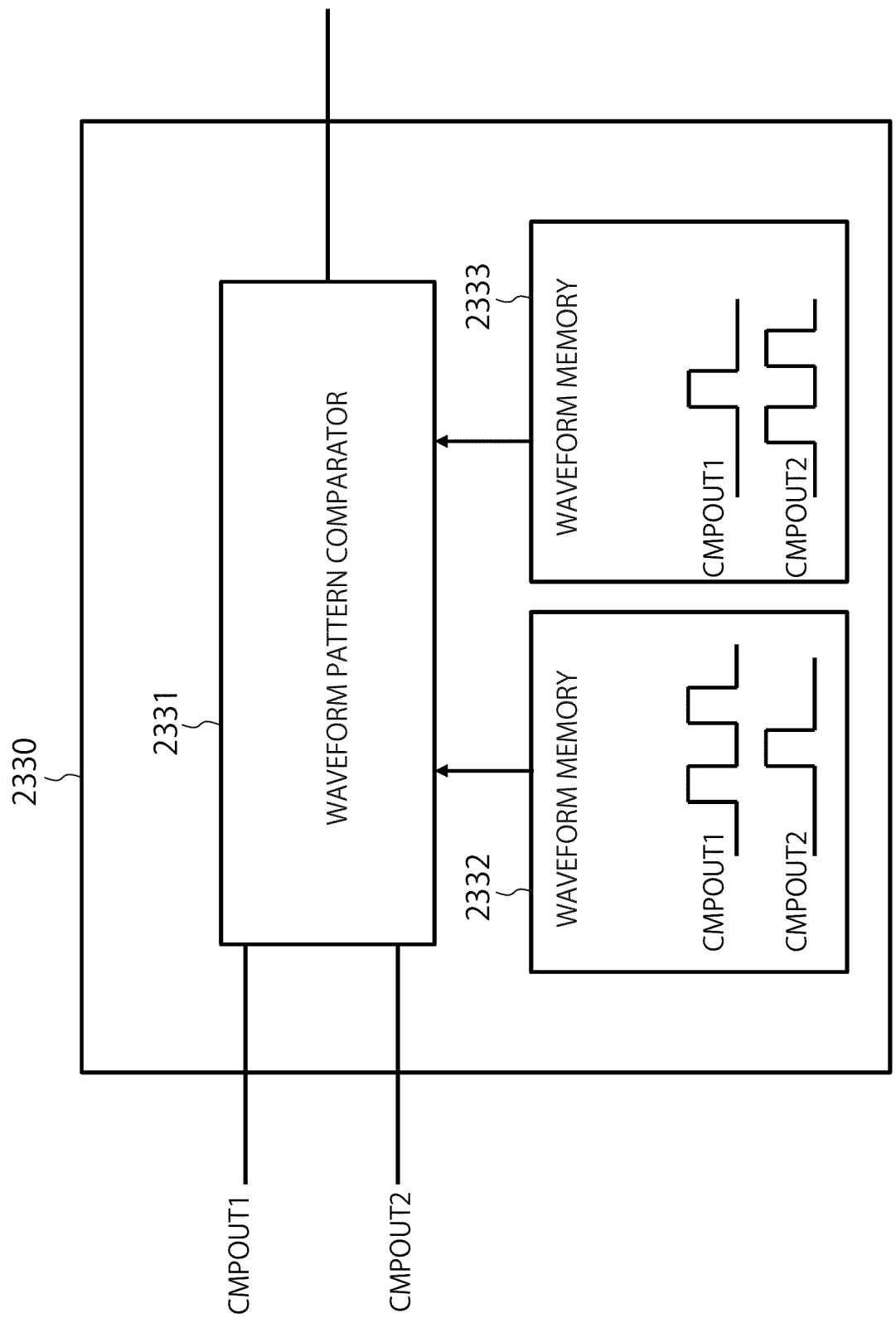
FIG. 15 is a diagram showing an overall configuration of a pulse detection circuit according to a variation.

FIG. 15 shows an overall configuration of a pulse detection circuit 2330 according to Variation 1.

According to Variation 1, transmitting and receiving circuitry 2000 includes receiving circuitry 2300. The receiving circuitry 2300 includes the pulse detection circuit 2330.

Except for the receiving circuitry 2300 and the pulse detection circuit 2330, a configuration of the transmitting and receiving circuitry 2000 is the same as that of the transmitting and receiving circuitry 1000, and thus description thereof will be omitted.

The pulse detection circuit 2330 includes a waveform pattern comparator 2331 and waveform memories 2332 and 2333.

The pulse detection circuit 2330 receives outputs CMPOUT1 and CMPOUT2 from the comparator 320 using the waveform pattern comparator 2331 without involving a flip-flop or the like.

The pulse detection circuit 2330 determines an inputted signal based on pulse patterns stored in memory.

The waveform pattern comparator 2331 compares inputted waveforms obtained as outputs of CMPOUT1 and CMPOUT2 with waveforms stored in the waveform memories 2332 and 2333, and outputs an appropriate signal if a degree of match is equal to or higher than a threshold.

For example, an H signal is outputted as a received signal if the inputted waveforms match the waveforms in the waveform memory 2332 and an L signal is outputted as a received signal if the inputted waveforms match the waveforms in the waveform memory 2333.

If a threshold for use to determine the degree of match is set appropriately, the waveform pattern comparator 2331 can be configured to prevent erroneous determination due to noise and the like.

The waveform memories 2332 and 2333 are storage cells configured to store waveforms corresponding to specific pulse patterns in advance.

The waveform memories 2332 and 2333 may also be called storages.

According to the present embodiment, pulse pattern 1 is stored in the waveform memory 2332. Similarly, pulse pattern 2 is stored in the waveform memory 2333.

According to Variation 1, the waveform pattern comparator 2331 can determine signals transmitted by an electronic circuit using elements other than flip-flops, without involving DET_H and DET_L.

(Variation 2)

Figure 16:
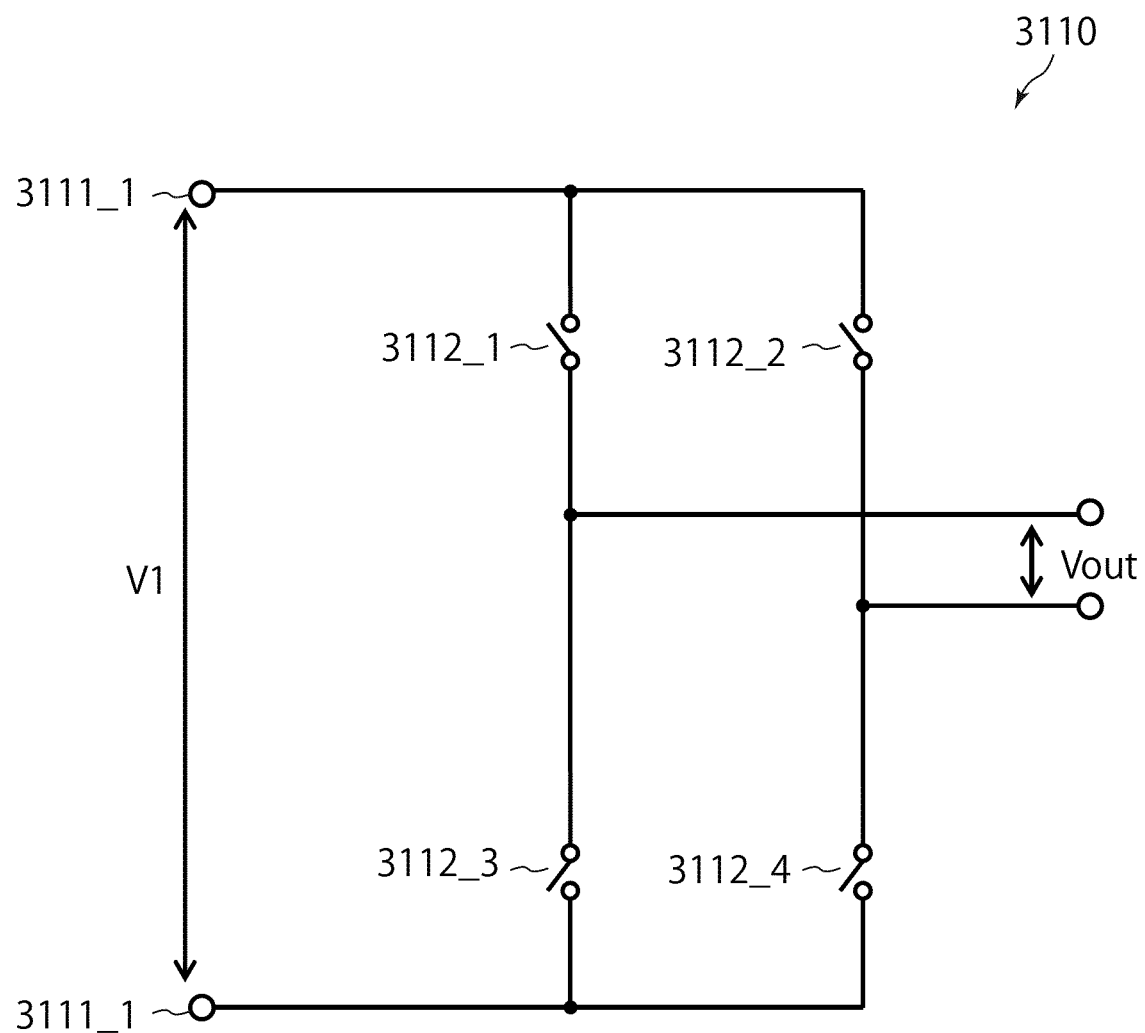
FIG. 16 is a diagram showing a configuration of a transmit pulse generation circuit according to a variation.
Figure 17:
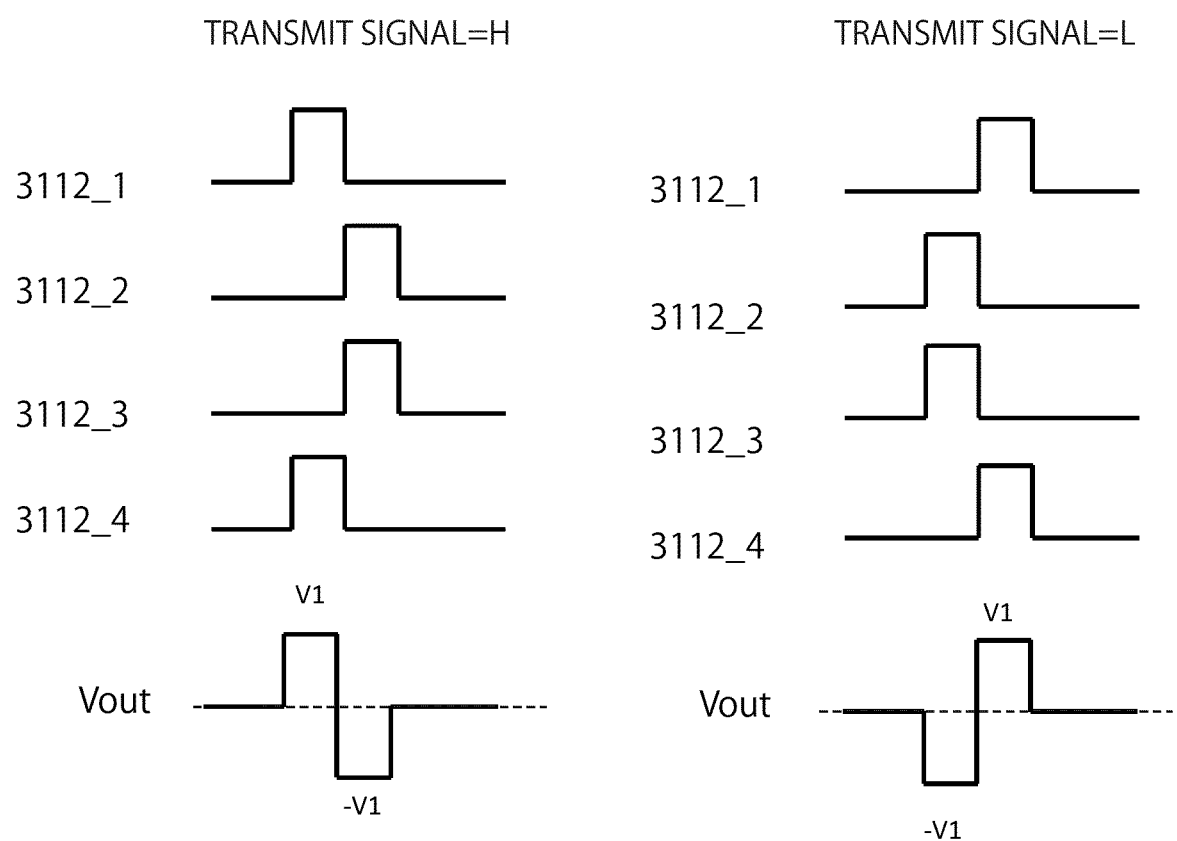
FIG. 17 is a diagram showing activation and deactivation of switches during signal transmission.

FIG. 16 shows a configuration of the transmit pulse generation circuit 3110. FIG. 17 shows activation and deactivation of switches during signal transmission.

According to Variation 2, the transmitting and receiving circuitry 3000 includes transmitting circuitry 3100. The transmitting circuitry 3100 includes the transmit pulse generation circuit 3110.

Except for the transmitting circuitry 3100 and the transmit pulse generation circuit 3110, a configuration of the transmitting and receiving circuitry 3000 is the same as that of the transmitting and receiving circuitry 1000, and thus description thereof will be omitted.

The transmitting circuitry 3100 includes the transmit pulse generation circuit 3110 and control signal generator 120.

The transmit pulse generation circuit 3110 generates pulse waveforms. According to the present embodiment, the transmit pulse generation circuit 3110 generates pulse waveforms based on differential voltage pulses.

The transmit pulse generation circuit 3110 includes a terminal 3111_1 with a voltage V1 applied thereto, and switches 3112_1 to 3111_4.

Whereas in the description given here, four switches are provided, the number of switches is not limited to this.

For example, to transmit an H signal, in the first transmit pulse, the switches 3112_1 and 3112_4 are turned ON simultaneously, thereby outputting a voltage V1 to Vout.

Next, in the second transmit pulse, the switches 3112_2 and 3112_3 are turned ON simultaneously, thereby outputting a voltage −V1 to Vout.

In other words, to transmit an H signal, as shown in FIG. 17, the switch 3112_1 is set to ON and OFF in order.

Similarly, the switch 3112_2 is set to OFF and ON in order. The switch 3112_3 is set to OFF and ON in order. The switch 3112_4 is set to ON and OFF in order.

Voltages are outputted to Vout in the following order: V1 and −V1.

For example, to transmit an L signal, in the first transmit pulse, the switches 3112_2 and 3112_3 are turned ON simultaneously, thereby outputting a voltage −V1 to Vout.

Next, in the second transmit pulse, the switches 3112_1 and 3112_4 are turned ON simultaneously, thereby outputting a voltage V1 to Vout.

In other words, to transmit an L signal, as shown in FIG. 17, the switch 3112_1 is set to OFF and ON in order.

Similarly, the switch 3112_2 is set to ON and OFF in order. The switch 3112_3 is set to ON and OFF in order. The switch 3112_4 is set to OFF and ON in order.

Voltages are outputted to Vout in the following order: −V1 and V1.

According to Variation 1, if the voltage V1 outputted to Vout is High and the voltage −V1 is Low, the transmit pulses transmitted by the transmitting circuitry 3100 may be, for example, differential voltage pulses other than current pulses.

(Variation 3)

Figure 18:
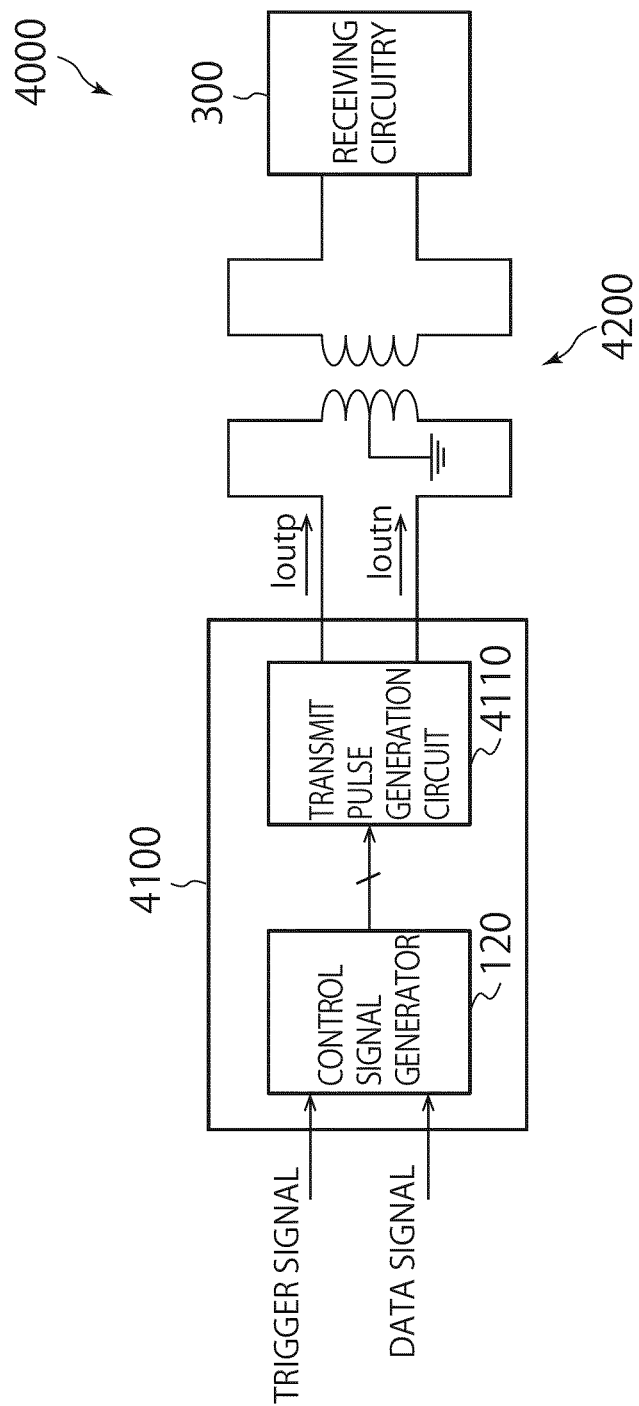
FIG. 18 is a diagram showing an overall configuration of transmitting and receiving circuitry according to a variation.

FIG. 18 shows an overall configuration of transmitting and receiving circuitry 4000 according to Variation 3.

Figure 19:
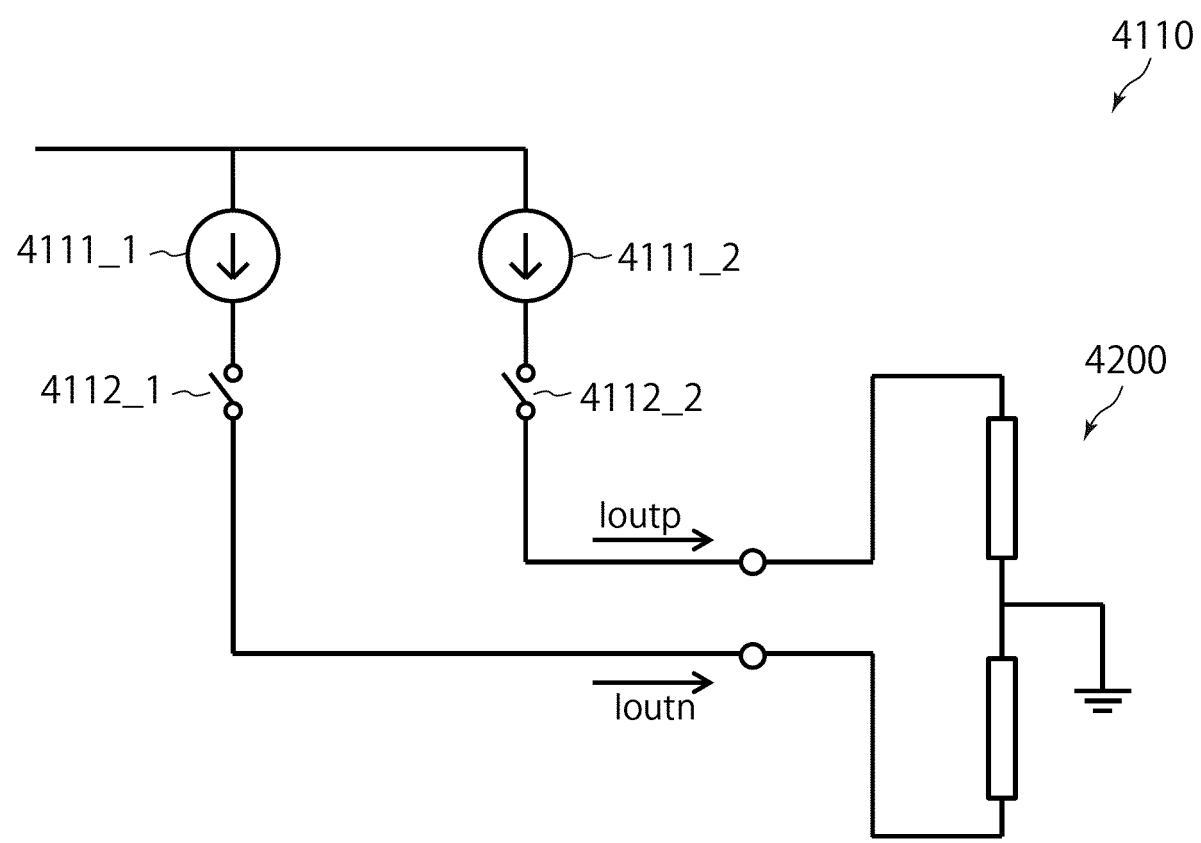
FIG. 19 is a diagram showing a circuit configuration of a transmit pulse generation circuit according to a variation.

FIG. 19 shows a circuit configuration of a transmit pulse generation circuit 4110 according to Variation 3.

Figure 20:
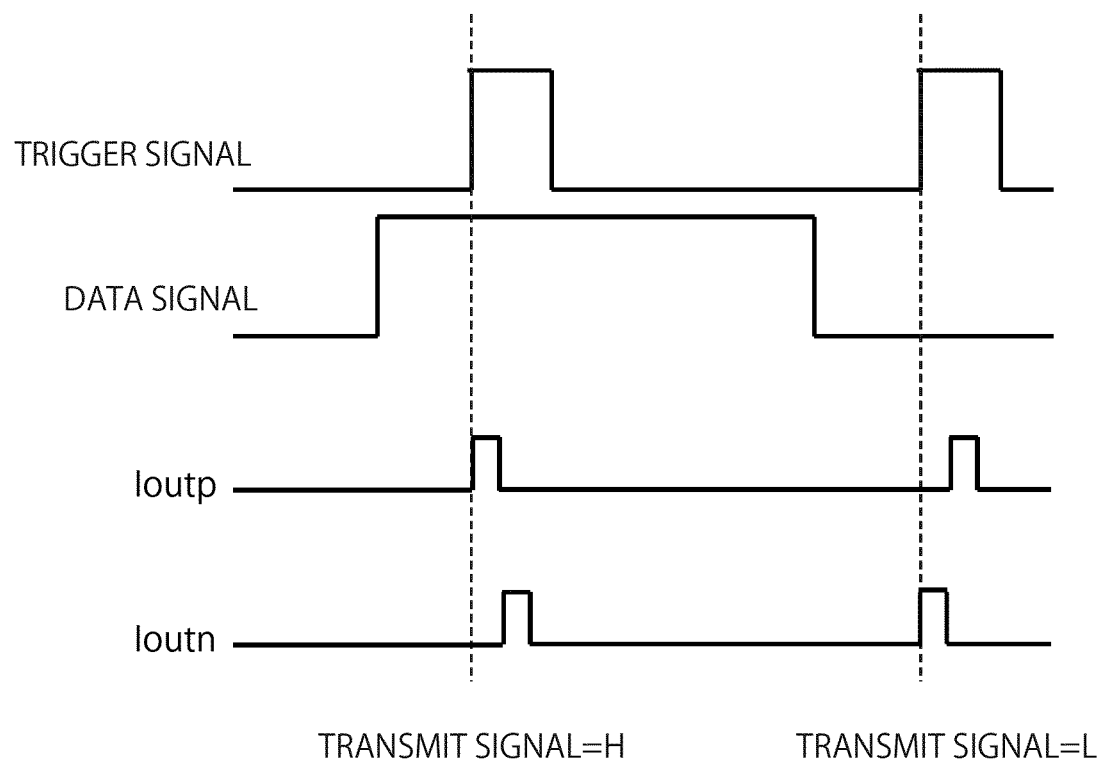
FIG. 20 is a diagram showing a transmit signal outputted in combination with a trigger signal and a data signal.

FIG. 20 shows a transmit signal outputted in combination with a trigger signal and a data signal.

Figure 21:
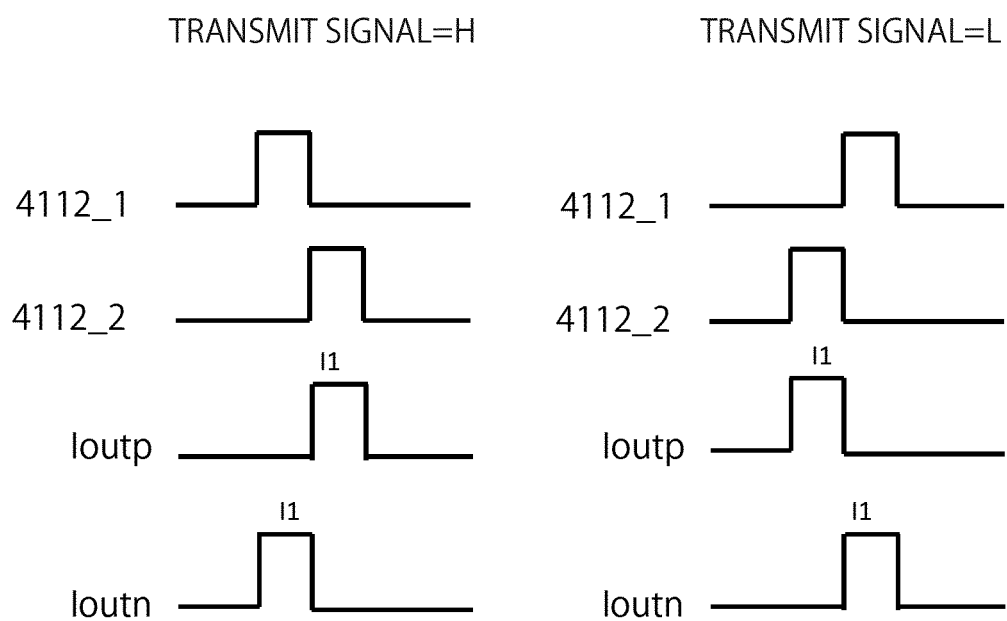
FIG. 21 is a diagram showing activation and deactivation of switches during signal transmission.

FIG. 21 shows activation and deactivation of switches during signal transmission.

According to Variation 3, transmitting and receiving circuitry 4000 includes transmitting circuitry 4100. The transmitting circuitry 4100 includes the transmit pulse generation circuit 4110.

Except for the transmitting circuitry 4100 and the transmit pulse generation circuit 4110, a configuration of the transmitting and receiving circuitry 4000 is the same as that of the transmitting and receiving circuitry 1000, and thus description thereof will be omitted.

The transmit pulse generation circuit 4110 generates pulse waveforms. According to the present embodiment, the transmit pulse generation circuit 4110 generates pulse waveforms based on pseudo differential current pulses.

By being connected, for example, with an insulation element 4200 whose midpoint is connected to a ground point, the transmit pulse generation circuit 4110 can also deal with a situation in which Ioutp and Ioutn outputted for the pseudo differential configuration do not become equal to each other.

Whereas according to the present embodiment, the insulation element 4200 is made up of a transformer, if connected to a ground point, the insulation element 4200 may be made up of an element such as a capacitor or a condenser other than a transformer.

For example, as shown in FIG. 20, at a time when a rising edge of a trigger signal is detected and the data signal is shown to be High, the transmit pulse generation circuit 4110 transmits an H signal.

For example, at a time when a rising edge of a trigger signal is detected and the data signal is shown to be Low, the transmit pulse generation circuit 4110 transmits an L signal.

The transmit pulse generation circuit 4110 includes current sources 4111_1 and 4111_2 and switches 4112_1 and 4112_2.

Whereas in the description given here, two current sources and two switches are provided, the numbers of current sources and switches are not limited to this.

For example, to transmit an H signal, in the first transmit pulse, the switch 4112_1 is turned ON, thereby outputting a current I1 to Ioutn.

Next, in the second transmit pulse, the switch 4112_2 is turned ON, thereby outputting a current of I1 to Ioutp.

In other words, to transmit an H signal, as shown in FIG. 21, the switch 4112_1 is set to ON and OFF in order.

Similarly, the switch 4112_2 is set to OFF and ON in order.

The currents flowing through Ioutp are outputted in the following order: no output and I1. The currents flowing through Ioutn are outputted in the following order: I1 and no output.

For example, to transmit an L signal, in the first transmit pulse, the switch 4112_1 is turned ON, thereby outputting a current of −I1 to Ioutn.

Next, in the second transmit pulse, the switch 4112_2 is turned ON, thereby outputting a current of I1 to Ioutp.

In other words, to transmit an L signal, as shown in FIG. 21, the switch 4112_1 is set to OFF and ON in order.

Similarly, the switch 4112_2 is set to ON and OFF in order.

The currents flowing through Ioutp are outputted in the following order: I1 and no output. The currents flowing through Ioutn are outputted in the following order: no output and I1.

According to Variation 3, the transmit pulses transmitted by the transmitting circuitry may be current pulses based on a pseudo differential current.

(Variation 4)

Figure 22:
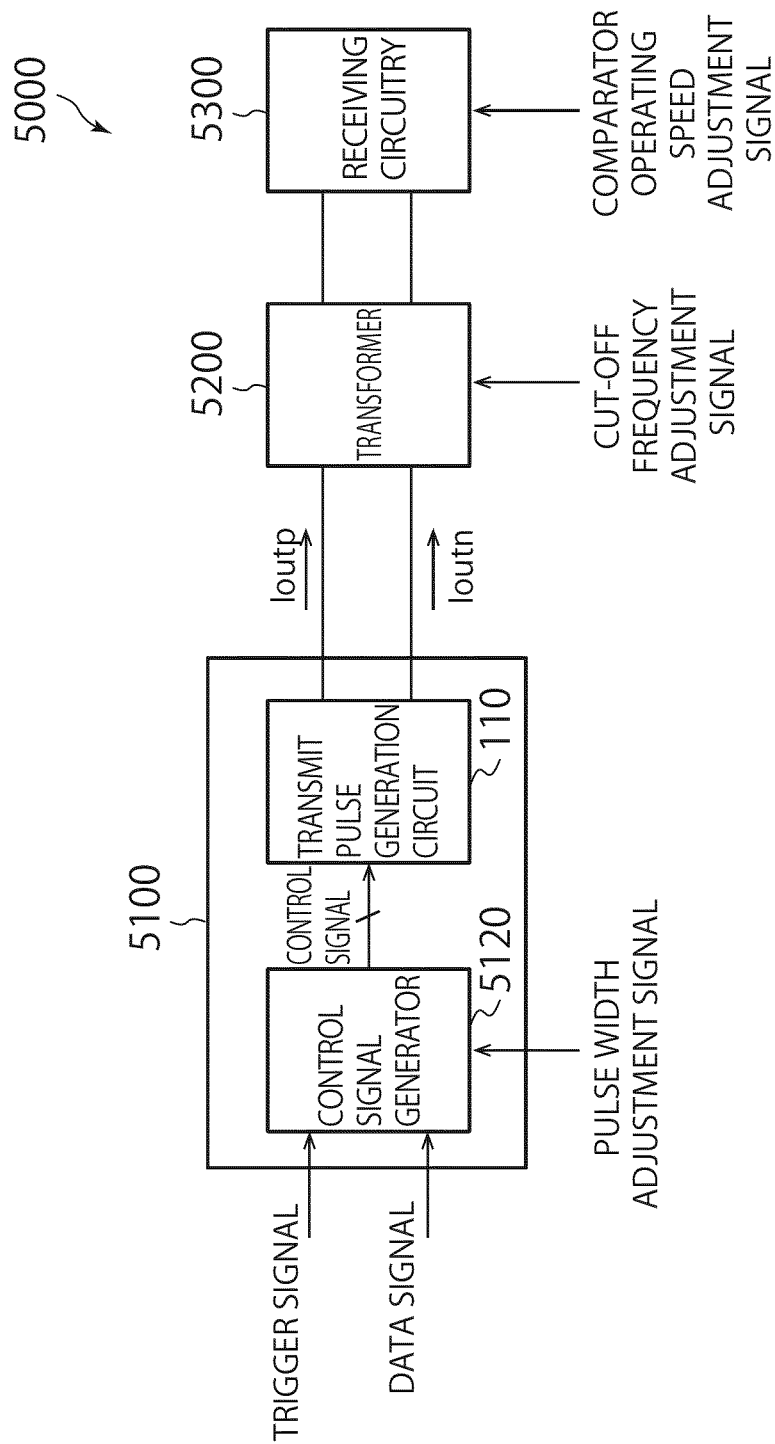
FIG. 22 is a diagram showing an overall configuration of transmitting and receiving circuitry according to a variation.
Figure 23:
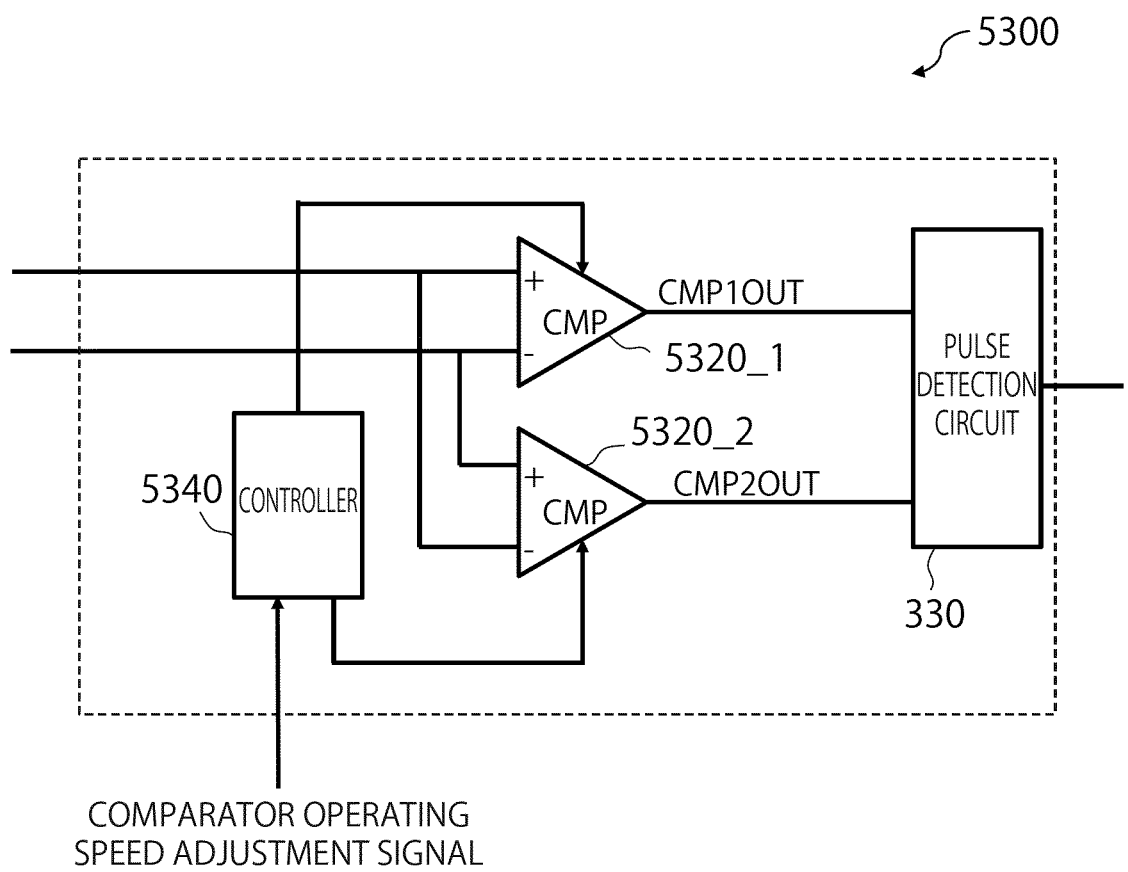
FIG. 23 is a diagram showing a configuration of receiving circuitry according to a variation.

FIG. 22 shows an overall configuration of transmitting and receiving circuitry 5000 according to Variation 4. FIG. 23 shows a configuration of receiving circuitry 5300 according to Variation 4.

According to Variation 4, the transmitting and receiving circuitry 5000 includes transmitting circuitry 5100, an insulation element 5200, and receiving circuitry 5300.

The transmitting circuitry 5100 includes the transmit pulse generation circuit 110 and a control signal generator 5120 (a control signal generation circuit). The receiving circuitry 5300 includes a comparator 5320, the pulse detection circuit 330, and a controller 5340.

Except for the control signal generator 5120 included in the transmitting circuitry 5100, the insulation element 5200, and the comparator 5320 and controller 5340 included in the receiving circuitry 5300, a configuration of the transmitting and receiving circuitry 5000 is the same as that of the transmitting and receiving circuitry 1000, and thus description thereof will be omitted. Based on a signal received from outside, the transmitting and receiving circuitry 5000 appropriately adjusts a relationship between cut-off frequency and pulse width.

In the transmitting and receiving circuitry 5000, pulse width, i.e., a pulse period, affects a signal transmission rate. The smaller the pulse width, i.e., the shorter the pulse period, the higher the transmission speed of the signal can be.

In the receiving circuitry 5300, to detect pulses of a small pulse width, it is necessary to increase operating speed of the comparator 5320.

In the receiving circuitry 5300, the higher the operating speed of the comparator 5320, the higher the power consumption.

In the transmitting and receiving circuitry 5000, if the operating speed of the comparator 5320 is fixed based on the highest transmission rate needed for signal transmission, power is consumed based on the operating speed.

In the transmitting and receiving circuitry 5000, even after a signal is transmitted at the highest transmission rate, the comparator 5320 needs to operate at high speed at high power consumption.

The transmitting and receiving circuitry 5000 can reduce power consumption by adjusting the speed of the comparator 5320 according to the necessary transmission rate.

The control signal generator 5120 controls the pulse width of the transmit pulse based on a pulse width adjustment signal.

By adjusting the pulse width of the transmit pulse, the receiving circuitry 5300 described later can receive a signal transmitted by the transmitting circuitry 5100.

The insulation element 5200 changes cut-off frequency of the insulation element 5200 based on a cut-off frequency adjustment signal (second adjustment signal).

When the cut-off frequency is adjusted, the analog waveform including N pulses transmitted by the transmitting circuitry 5100 results in an output of an analog waveform including N+1 pulses.

The receiving circuitry 5300 receives a signal using the comparator 5320 whose operating speed has been adjusted based on a comparator operating speed adjustment signal (first adjustment signal).

Based on the received comparator operating speed adjustment signal (first adjustment signal), the controller 5340 adjusts the operating speed of the comparator 5320.

According to Variation 4, the comparator 5320 includes a comparator 5320_1 and a comparator 5320_2, which are opposite to each other in terms of inverting input connection and non-inverting input connection.

The comparator 5320_1 and the comparator 5320_2 operate at operating speeds adjusted by the controller 5340.

The controller 5340 can readjust the operating speed of the comparator 5320 adjusted once. For example, if the comparator operating speed adjustment signal is changed, the operating speed of the comparator 5320 can be changed based on the signal.

According to Variation 4, the controller 5340 configured to receive the comparator operating speed adjustment signal and the comparator 5320 are provided separately, but may be provided integrally. For example, the comparator 5320 may receive the comparator operating speed adjustment signal directly and adjust an operation signal based on the received signal.

Whereas the pulse width adjustment signal, the cut-off frequency adjustment signal, and the comparator operating speed adjustment signal are provided from outside according to Variation 4, fixed values may be set during manufacturing or before shipment.

According to Variation 4, by adjusting the pulse width, the cut-off frequency, and the comparator operating speed according to the necessary transmission rate, power consumption can be reduced regardless of the input signal.

(Variation 5)

Figure 24:
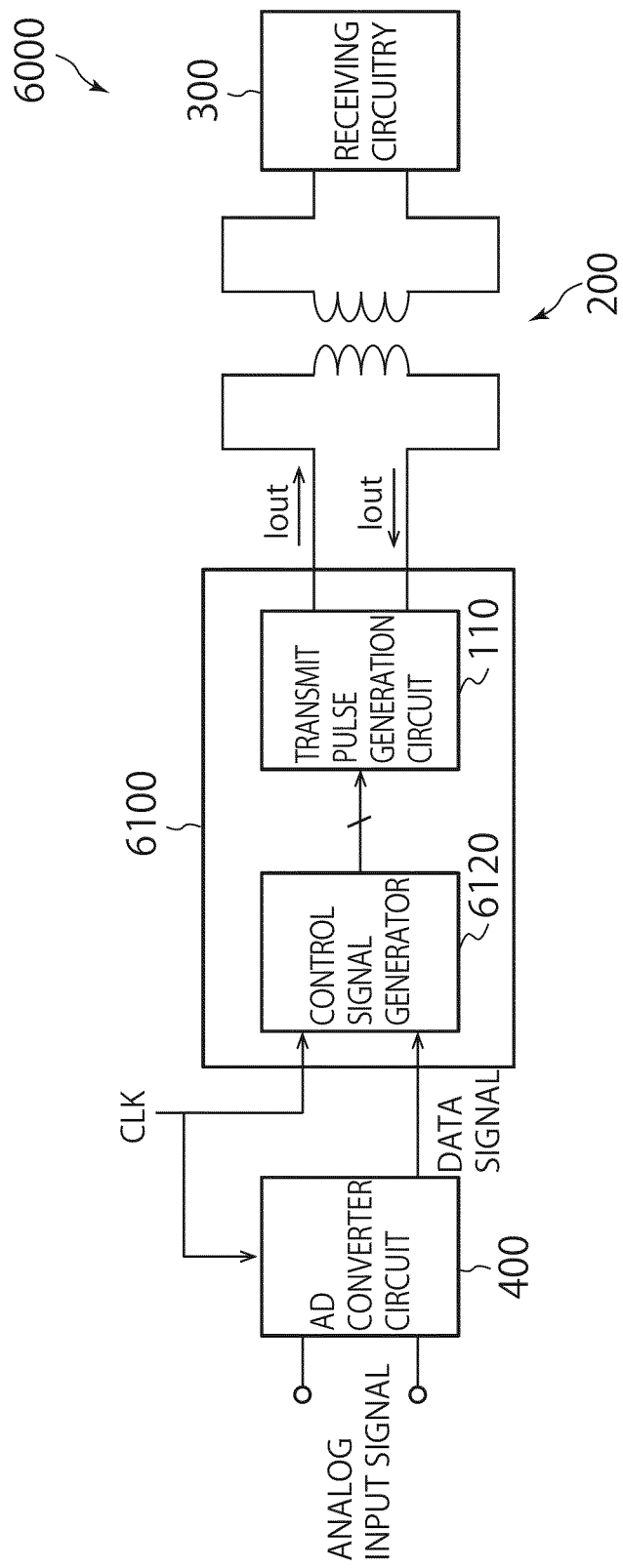
FIG. 24 is a diagram showing an overall configuration of transmitting and receiving circuitry according to a variation.

FIG. 24 shows an overall configuration of transmitting and receiving circuitry 6000 according to Variation 5.

According to Variation 5, the transmitting and receiving circuitry 6000 includes transmitting circuitry 6100, the insulation element 200, the receiving circuitry 300, and an AD converter circuit 400.

The transmitting circuitry 6100 includes the transmit pulse generation circuit 110 and a control signal generator 6120 (a control signal generation circuit).

Except for the control signal generator 6120 included in the transmitting circuitry 6100 as well as the AD converter circuit 400, a configuration of the transmitting and receiving circuitry 6000 is the same as that of the transmitting and receiving circuitry 1000, and thus description thereof will be omitted.

The transmitting and receiving circuitry 6000 accepts analog input signals as input. The transmitting and receiving circuitry 6000 functions as an isolation amplifier that transmits analog signals in an insulated manner.

The AD converter circuit 400 converts analog input signals into digital input signals. The AD converter circuit 400 may also be called an AD converter. The AD converter circuit 400, which is also called an analog-digital converter circuit, can use a flash ADC, pipeline ADC, a ΔΕ modulator, and the like.

The AD converter circuit 400 and the control signal generator 6120 accept a CLK signal (clock signal) as input.

By being timed with the CLK signal, the AD converter circuit 400 converts an analog input signal into a digital signal and outputs the digital signal as a data signal.

Based on the CLK signal, the control signal generator 6120 captures the data signal while the output from the AD converter circuit 400 remains unchanged and generates a control signal intended for the transmit pulse generation circuit 110.

For example, the output signal of the AD converter circuit 400 changes on a rising edge of the CLK signal, and the control signal generator 6120 captures the data signal on the falling edge and generates a control signal.

Variation 5 makes it possible to convert an analog signal accepted as input into a digital signal and transmit the digital signal to the receiving circuitry 300.

(Variation 6)

Figure 25:
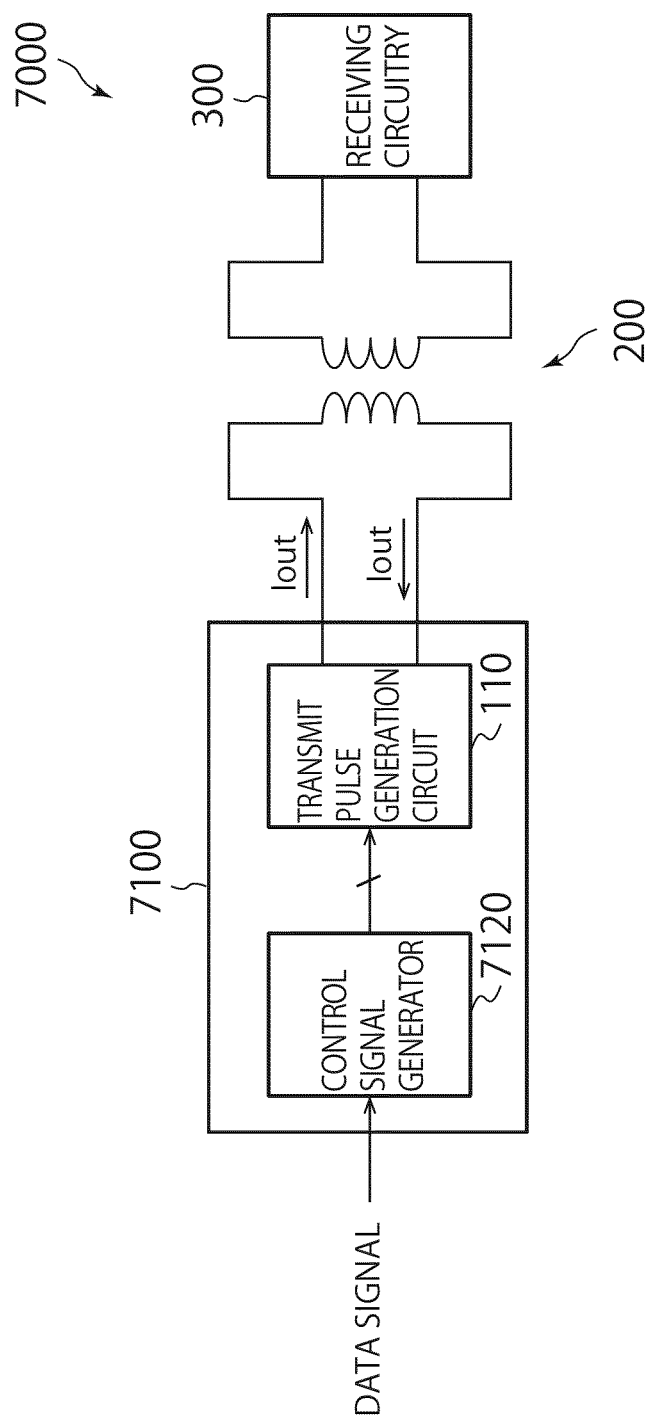
FIG. 25 is a diagram showing an overall configuration of transmitting and receiving circuitry according to a variation.

FIG. 25 is a diagram showing an overall configuration of transmitting and receiving circuitry 7000 according to Variation 6.

Figure 26:
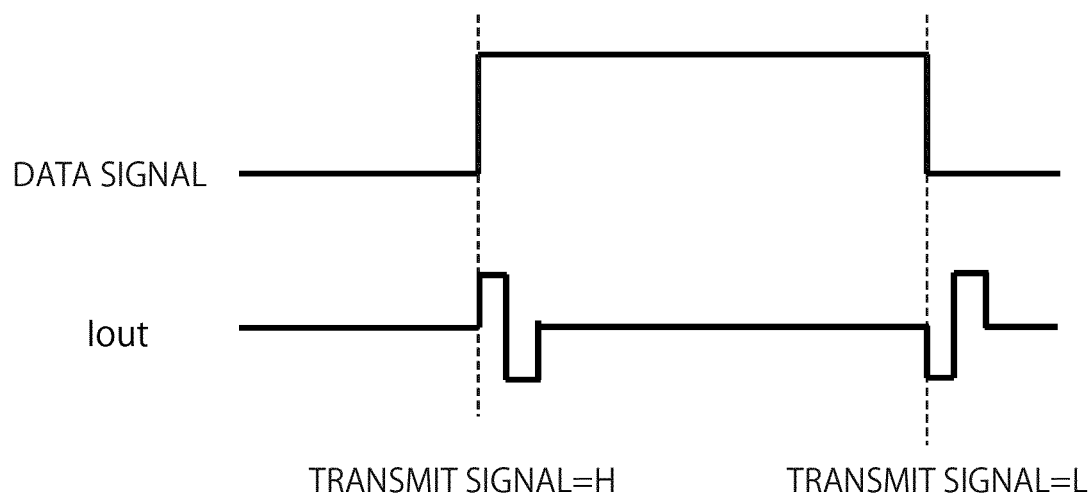
FIG. 26 is a diagram showing a transmit signal outputted in combination with a data signal.

FIG. 26 shows a transmit signal outputted in combination with a data signal.

According to Variation 6, the transmitting and receiving circuitry 7000 includes transmitting circuitry 7100, the insulation element 200, and the receiving circuitry 300.

The transmitting circuitry 7100 includes the transmit pulse generation circuit 110 and a control signal generator 7120 (a control signal generation circuit).

Except for the control signal generator 7120 included in the transmitting circuitry 7100 a configuration of the transmitting and receiving circuitry 7000 is the same as that of the transmitting and receiving circuitry 1000, and thus description thereof will be omitted.

The transmitting circuitry 7100 transmits signals in response to transition of a data signal.

The control signal generator 7120 generates control signals for use to control operation of the switches included in the transmit pulse generation circuit 110.

The control signal generator 7120 controls switch operation of the transmit pulse generation circuit 110 based on the data signal.

The data signal indicates the type of signal outputted by a transmit pulse. The data signal allows determination as to whether the data signal is High or Low.

The control signal generator 7120 controls the switches included in the transmit pulse generation circuit 110 such that transmit pulses will be outputted according to changes of the data signal between High and Low.

According to Variation 6, when a rising edge of the data signal is detected, the control signal generator 7120 transmits an H signal. When a falling edge of the data signal is detected, the control signal generator 7120 transmits an L signal.

The data signal may be an input signal that causes an analog waveform (first waveform) to be outputted, in response to transition of the data signal.

Here, the transition of the data signal means changes in the state of the data signal. The transition of the data signal occurs, for example, as a rising edge and a falling edge of the data signal.

According to Variation 6, the control signal generator 7120 can control transmission and reception of signals using the data signal.

(Variation 7)

Figure 27:
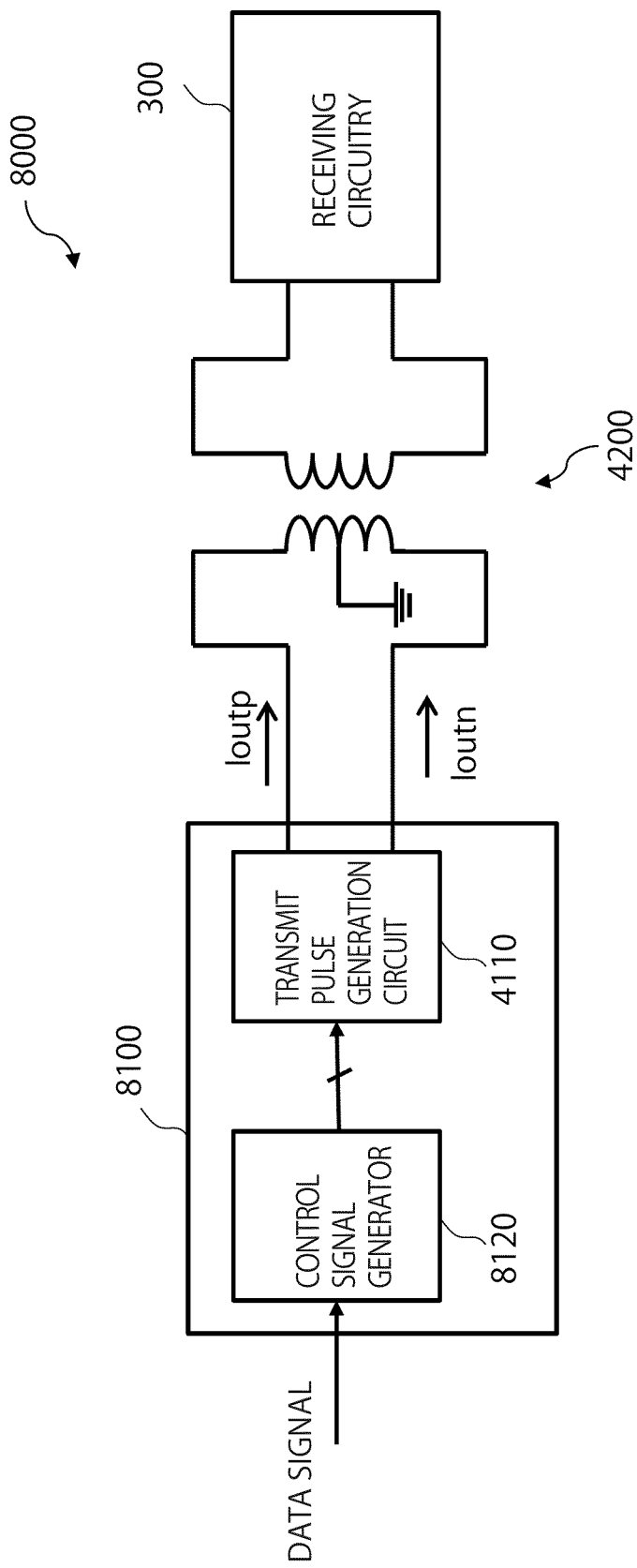
FIG. 27 is a diagram showing an overall configuration of transmitting and receiving circuitry according to a variation.

FIG. 27 shows an overall configuration of transmitting and receiving circuitry 8000 according to Variation 7.

According to Variation 7, the transmitting and receiving circuitry 8000 includes transmitting circuitry 8100, the insulation element 4200, and the receiving circuitry 300.

The transmitting circuitry 8100 includes the transmit pulse generation circuit 4110 and a control signal generator 8120 (a control signal generation circuit).

Except for the control signal generator 8120 included in the transmitting circuitry 8100, a configuration of the transmitting and receiving circuitry 8000 is the same as that of the transmitting and receiving circuitry 4000, and thus description thereof will be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Electronic circuitry comprising:
   transmitting circuitry configured to output a first waveform including N pulse waveforms (N is a natural number larger than 1) in response to an input signal;
   transfer circuitry configured to transfer the first waveform to a second waveform that includes at least (N+1) pulse waveforms, via electromagnetic coupling; and
   receiving circuitry configured to receive the second waveform and determining the input signal based on the at least (N+1) pulse waveforms,
   wherein the receiving circuitry includes a pulse detection circuit configured to determine the at least (N+1) pulse waveforms included in the second waveform, based on a pulse pattern,
   the pulse detection circuit comprises (N+1) flip-flops connected in series and a signal determination circuit configured to determine a first output signal outputted by an (N+1)th flip-flop of the (N+1) flip-flops,
   an $M^{th}$ flip-flop of the (N+1) flip-flops (M is a natural number between 1 and N, both inclusive) outputs an output signal to an $(M+1)^{th}$ flip-flop of the (N+1) flip-flops, in response to an $M^{th}$ pulse waveform included in the second waveform, the output signal outputted from the $(N+1)^{th}$ flip-flop being the first output signal,
   the signal determination circuit is configured to determine that the first output signal is outputted from the $(N+1)^{th}$ flip-flop to output a second output signal, and
   the pulse detection circuit detects the at least (N+1) pulse waveforms based on the second output signal.

2. The electronic circuitry according to claim 1, wherein: the receiving circuitry further includes a comparator configured to detect the at least (N+1) pulse waveforms included in the second waveform; and
   the comparator outputs a signal according to a polarity of the at least (N+1) pulse waveforms.

3. The electronic circuitry according to claim 2, wherein: the comparator includes a first comparator and a second comparator; and
   an inverting input of the first comparator and a non-inverting input of the second comparator are connected with each other, and a non-inverting input of the first comparator and an inverting input of the second comparator are connected with each other.

4. The electronic circuitry according to claim 2, wherein the comparator is further configured to change an operating speed of the comparator based on a first adjustment signal.

5. The electronic circuitry according to claim 4, wherein the transfer circuitry extracts a specific frequency band of the first waveform and outputs a signal of the extracted specific frequency band as the second waveform.

6. The electronic circuitry according to claim 5, wherein the transfer circuitry is configured to change the specific frequency band based on a second adjustment signal.

7. The electronic circuitry according to claim 5, wherein the transfer circuitry is an insulation element.

8. The electronic circuitry according to claim 7, wherein the insulation element is a transformer or a condenser.

9. The electronic circuitry according to claim 1, wherein the pulse detection circuit comprises a storage storing the pulse pattern, wherein
   the pulse detection circuit is configured to determine whether the at least (N+1) pulse waveforms included in the second waveform match the pulse pattern in the storage.

10. The electronic circuitry according to claim 1, wherein the transmitting circuitry includes a transmit pulse generation circuit configured to generate the N pulse waveforms; and
    the transmit pulse generation circuit includes first current sources and a plurality of switches configured to control outputs of the first current sources, and the transmit pulse generation circuit is configured to generate the N pulse waveforms by combining outputs from the first current sources based on opening and closing of two of the plurality of switches.

11. The electronic circuitry according to claim 10, wherein the transmitting circuitry further includes a control signal generation circuit configured to control the input signal of the transmit pulse generation circuit based on a data signal that indicates a pulse polarity of the N pulse waveforms to be outputted.

12. The electronic circuitry according to claim 11, wherein the control signal generation circuit is configured to further control the input signal of the transmit pulse generation circuit based on a trigger signal that indicates output timing of the N pulse waveforms.

13. The electronic circuitry according to claim 1, wherein the N pulse waveforms are current pulses and are outputted based on a differential current or a pseudo differential current.

14. The electronic circuitry according to claim 1, wherein the N pulse waveforms are voltage pulses and are outputted based on a differential voltage.

15. The electronic circuitry according to claim 1, wherein the transmitting circuitry outputs the first waveform as an analog waveform.

16. The electronic circuitry according to claim 1, further comprising an analog-to-digital (AD) converter configured to convert an analog input signal into a digital input signal, wherein:
    the AD converter outputs the digital input signal based on timing of a clock signal; and
    based on the timing of the clock signal, the transmitting circuitry receives the digital input signal and transmits the N pulse waveforms.

17. The electronic circuitry according to claim 1, wherein the N pulse waveforms include a first transmit pulse waveform and a second transmit pulse waveform following the first transmit pulse waveform, and
    the first transmit pulse waveform is larger in amplitude than the second transmit pulse waveform.

18. A method comprising:
    outputting a first waveform including N pulse waveforms (N is a natural number larger than 1) in response to an input signal;

transferring the first waveform to a second waveform that includes at least (N+1) pulse waveforms, via electro-magnetic coupling;

receiving the second waveform and determining the input signal based on the at least (N+1) pulse waveforms;

determining the at least (N+1) pulse waveforms included in the second waveform, based on a pulse pattern;

determining a first output signal outputted by an $(N+1)^{th}$ flip-flop of (N+1) flip-flops connected in series;

outputting an output signal from an $M^{th}$ flip-flop of the (N+1) flip-flops (M is a natural number between 1 and N, both inclusive) to an $(M+1)^{th}$ flip-flop of the (N+1) flip-flops, in response to an $M^{th}$ pulse waveform included in the second waveform, the output signal outputted from the $(N+1)^{th}$ flip-flop being the first output signal;

determining that the first output signal is outputted from the $(N+1)^{th}$ flip-flop to output a second output signal; and detecting the at least (N+1) pulse waveforms based on the second output signal.

* * * * *